United States Patent [19]

Ohmi et al.

[11] Patent Number: 5,650,650

[45] Date of Patent: Jul. 22, 1997

[54] HIGH SPEED SEMICONDUCTOR DEVICE WITH A METALLIC SUBSTRATE

[75] Inventors: Tadahiro Ohmi, 1-170301, Komegabukuro 2-chome, Aoba-ku, Miyagi-ken 980; Hisayuki Shimada; Masaki Hirayama, both of Miyagi-ken, all of Japan

[73] Assignee: Tadahiro Ohmi, Miyagi-ken, Japan

[21] Appl. No.: 454,324

[22] PCT Filed: Dec. 21, 1993

[86] PCT No.: PCT/JP93/01850

§ 371 Date: Aug. 10, 1995

§ 102(e) Date: Aug. 10, 1995

[87] PCT Pub. No.: WO94/15366

PCT Pub. Date: Jul. 7, 1994

[30] Foreign Application Priority Data

Dec. 24, 1992 [JP] Japan .................................... 4-343030
Jun. 28, 1993 [JP] Japan .................................... 5-181998

[51] Int. Cl.⁶ ............................................... H01L 27/01
[52] U.S. Cl. ............................ 257/351; 257/410; 257/411; 257/406; 257/395
[58] Field of Search ................................ 257/347, 349, 257/350, 351, 352, 353, 354, 395, 406, 408, 410, 411

[56] References Cited

U.S. PATENT DOCUMENTS

| 5,289,027 | 2/1994 | Terrill et al. | 257/347 |
| 5,422,505 | 6/1995 | Shirai | 257/411 |

FOREIGN PATENT DOCUMENTS

| 58-56466 | 4/1983 | Japan | 257/347 |
| 59-210671 | 11/1984 | Japan | 257/347 |
| 60-200564 | 10/1985 | Japan | 257/351 |
| 61-276256 | 12/1986 | Japan | 257/347 |
| 1-86543 | 3/1989 | Japan | 257/714 |
| 3-74880 | 3/1991 | Japan | 257/347 |
| 4-360580 | 12/1992 | Japan | 257/347 |

*Primary Examiner*—Minh-Loan Tran
*Attorney, Agent, or Firm*—Marshall, O'Toole, Gerstein, Murray & Borun

[57] ABSTRACT

The semiconductor device has a large capacity of power driving, and can operate at a high speed. A first semiconductor region of a first conductivity type is formed on a metal substrate through a first insulating film. In the first semiconductor region, first source and drain regions of a second conductivity type are formed. Further, on the region which isolates the first source and drain regions, a first metallic gate electrode is formed through a second insulating film.

13 Claims, 21 Drawing Sheets

FIG. 3A
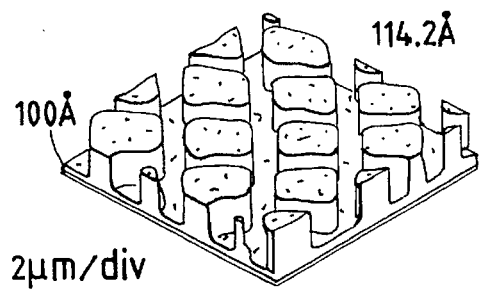
114.2Å
100Å
2μm/div
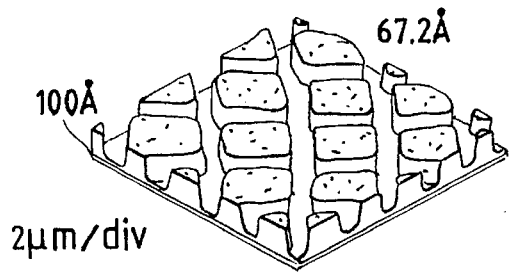
67.2Å
100Å
2μm/div
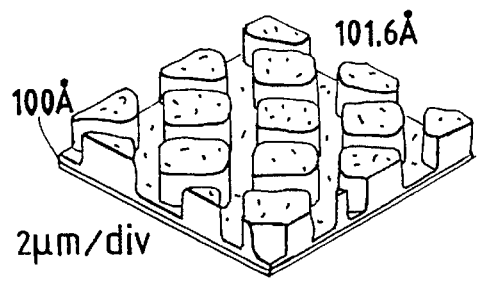
101.6Å
100Å
2μm/div
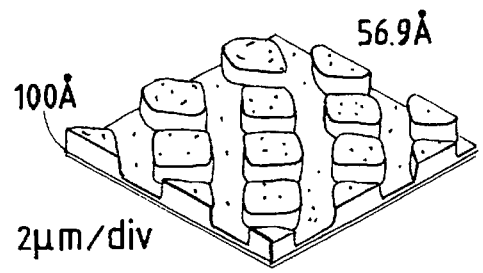
56.9Å
100Å
2μm/div
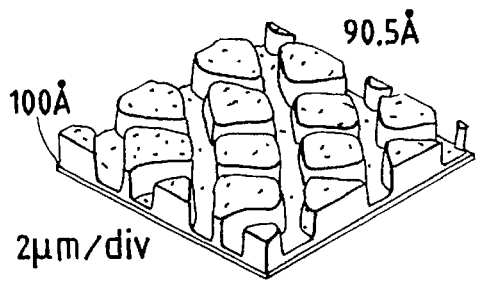
90.5Å
100Å
2μm/div
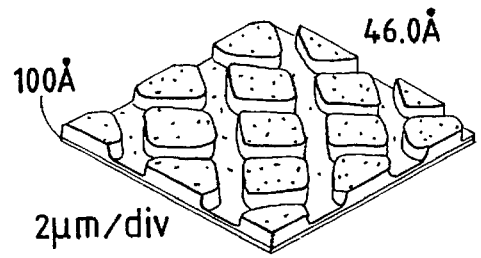
46.0Å
100Å
2μm/div
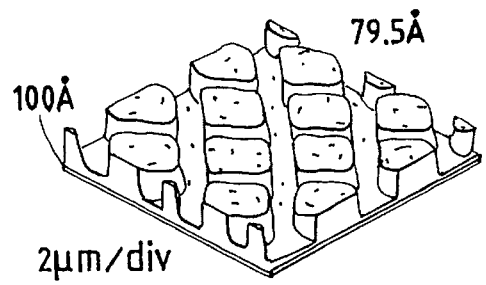
79.5Å
100Å
2μm/div
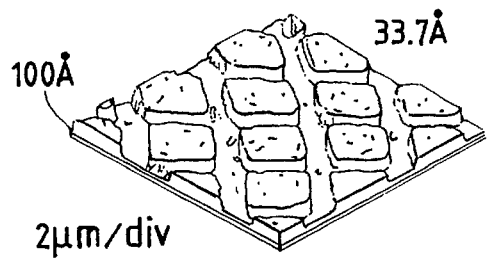
33.7Å
100Å
2μm/div

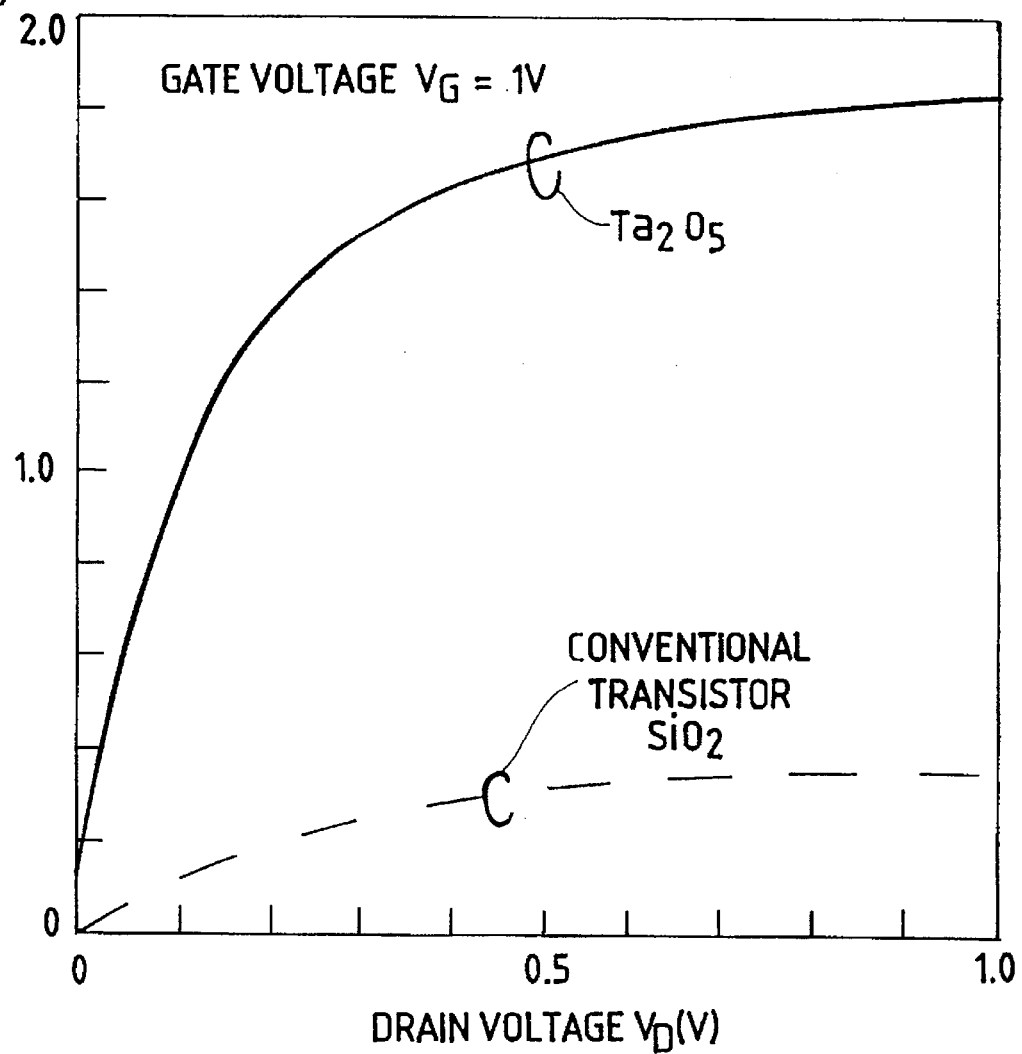

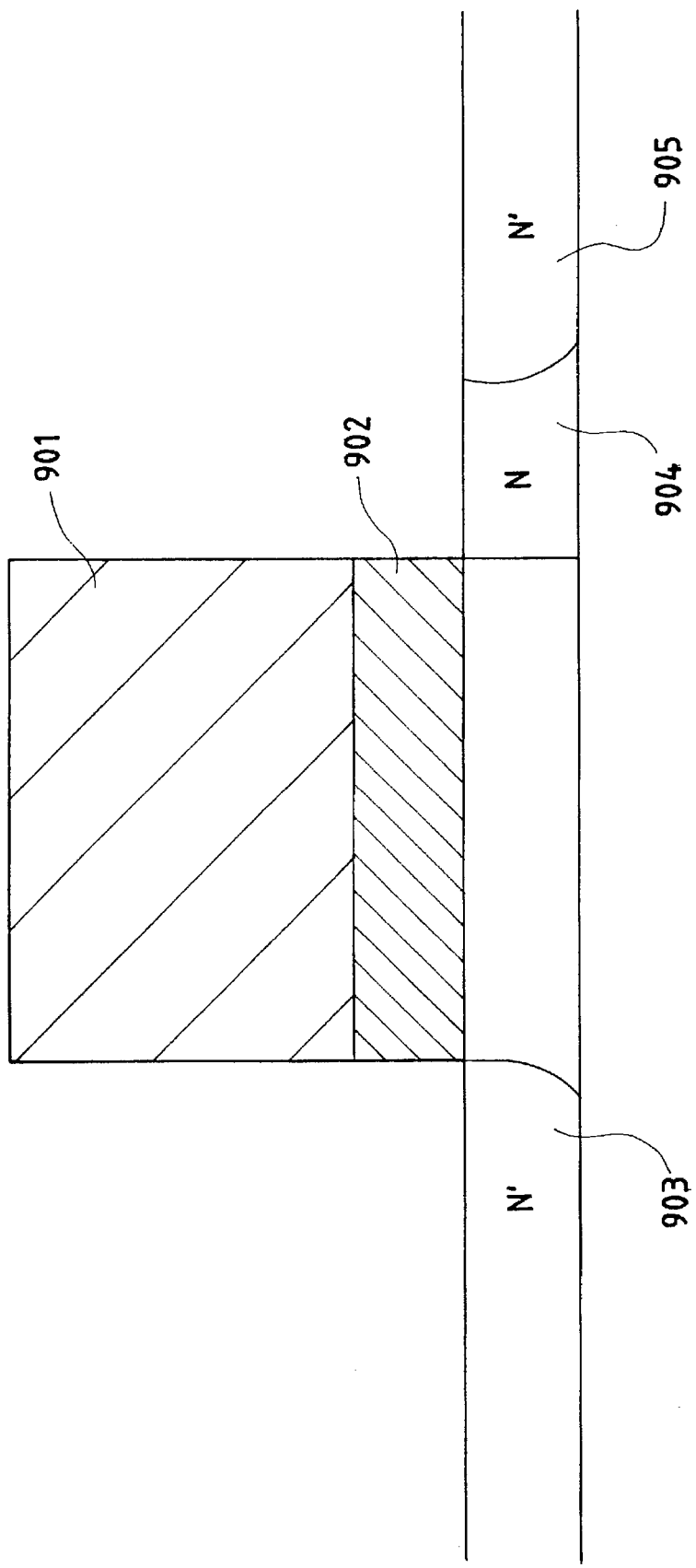

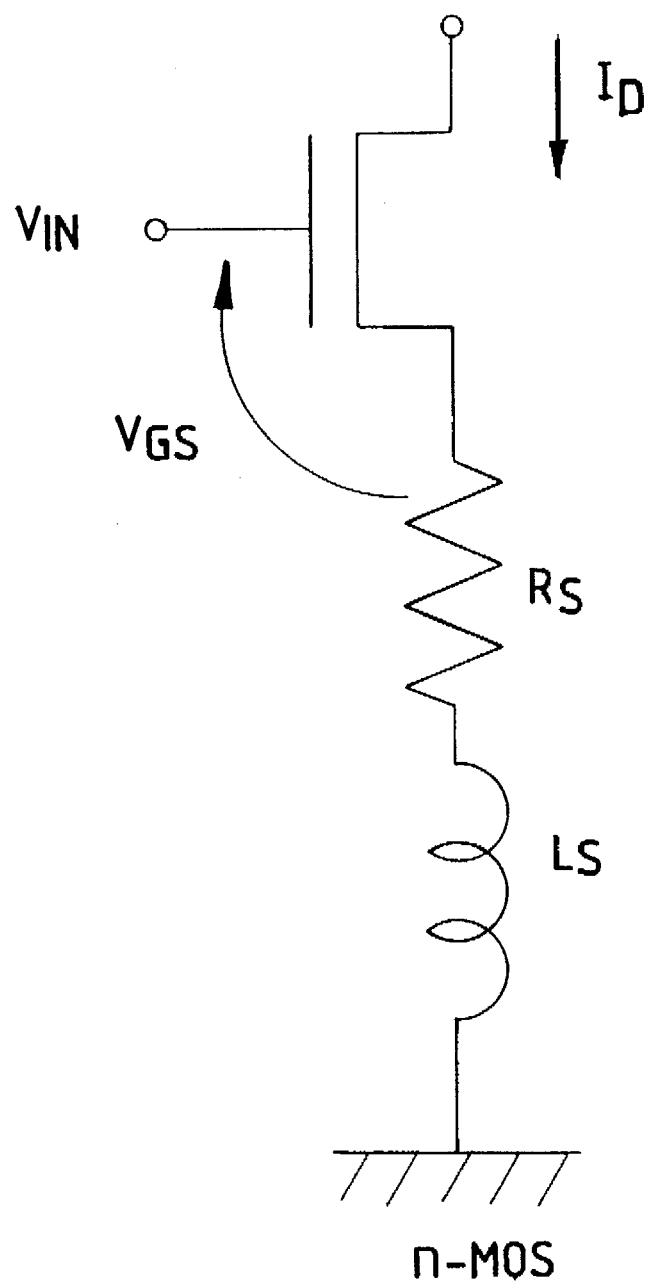

HIGH SPEED SEMICONDUCTOR DEVICE WITH A METALLIC SUBSTRATE

TECHNICAL FIELD

The present invention relates to a semiconductor device, and in particular relates to a semiconductor which is capable of ultra high speed operation.

BACKGROUND ART

Presently, semiconductor integrated circuit technology is developing at an astonishing rate. Much of this amazing progress has come about due to the development of extremely small elements. By means of this great reduction in size of the elements, it has become possible to integrate a greater number of elements on a single chip, and as a result, it has become possible to realize a greater number of functions. Furthermore, a high operational speed has also been achieved as a result of the reduction in size of the elements.

The range in research into ultra high speed LSI has included research into various devices, such as very small CMOS elements, BiCMOS elements, heterobipolar elements, GaAs elements, Josephson elements, and the like. However, demands for ultra LSI at room temperatures are strong, and much is expected of silicon-based technologies in future semiconductor integrated circuit technology. Furthermore, when the reduction in logical swing resulting from the reduction in power source voltage accompanying the extreme reduction in the size of the elements, and the simplification of the manufacturing process, is taken into consideration, BiCMOS elements are also incapable of meeting the demands stated above, so that CMOS elements, which have superior symmetry in circuit operation and which permit a large noise margin, are indispensable in order to guarantee system reliability.

However, when conventional CMOS elements are employed, the power consumption, that is to say, the generation of heat, increases in proportion to the clock frequency, and this causes a problem in that the thermal noise level increases, and there is also the problem of the latch-up phenomenon.

The increase in the power consumption of the circuit resulting from high speed operation is a problem which is linked to the increase of temperature within the chip and to a deterioration in reliability and operational performance. If the thermal resistance of the circuit is represented by $R_t$ (° C./W) the power consumption is represented by P(W), and the increase in temperature is represented by $\Delta T$(°C.), then the relationship $\Delta T = R t \cdot P$ obtains. If $\Delta T$ is set to the allowable temperature increase of the circuit, then the smaller the value of Rt, the greater the possible value of P, and the higher the speed at which operation is possible. That is to say, in high speed circuit operations, it is necessary to reduce the thermal resistance in the circuit as much as possible.

It is a commonly known fact that the power driving capacity of a MOSFET increases with decreasing size. Formula (1) below shows the current/voltage relationship in the saturation region of the MOSFET.

$$I_D = (W/2L) \cdot \mu_c \cdot C_{ox} \cdot (V_G - V_{TH})^2 \quad (1)$$

That is, $$C_{ox} = (\epsilon_r \cdot \epsilon_0)/d_{ox}$$

Here,

W: gate width
L: gate length
$\mu_c$: channel mobility
$C_{ox}$: gate insulating film capacitance per unit of surface area
$V_G$: gate voltage
$V_{TH}$: threshold voltage
$\epsilon_r$: relative dielectric constant of the gate insulating film
$\epsilon_0$: dielectric constant in a vacuum
$d_{ox}$: thickness of the gate oxide film Now, it will be assumed that the dimensions of the device are scaled down by a factor $1/\alpha$ ($\alpha$>1). Even if gate width W and gate length L are both reduced by the factor $1/\alpha$, the drain current $I_D$ which enables driving does not change. On the other hand, if the thickness $d_{ox}$ of the gate oxide film is reduced by the factor $1/\alpha$, the gate insulating film capacitance $C_{ox}$ increases by a factor $\alpha$, and the drain current $I_D$ enabling driving increases by the factor $\alpha$. Furthermore, the load capacitance driven by this transistor (the normal gate capacitance) is expressed by $C_{ox} \cdot L \cdot W$; however, this value is reduced by the factor $1/\alpha$. Accordingly, the amount of time necessary to charge or discharge the load capacitance is shortened by the factor $1/\alpha^2$. In this way, as a result of the increase in the current driving capacitance of the elements and the reduction in the load capacitance accompanying a great reduction in the size of the elements, higher speeds are attained.

However, at this point the pace of development towards decreasing element size has slowed as a result of limitations in principle or limitations in manufacturing devices. For example, the planar dimensions such as gate length L and the like have reached a level of 0.2–0.5 μm, which is the theoretical limit for pattern formation by means of light. Attempts have been made to form patterns with dimensions of 0.1 μm or less using X rays or electron beams or the like; however, these are presently only at the development stage.

Furthermore, a $SiO_2$ thermal oxide film of common silicon has been used as the gate insulating film; however, the thickness thereof has been reduced to 5 nm, and this is approaching a limit. That is to say, with respect to the gate insulating film, when, under current conditions, this film reaches a thickness of approximately 3 nm, current flows as a result of the direct tunneling phenomenon, and the film no longer functions as an insulating film. In other words, it could be said of the insulating film that it has in principle reached a limit and cannot be made thinner. Accordingly, an increase in the current driving capacitance resulting from a further thinning of the gate oxide film would be extremely difficult.

On the other hand, as a result of the demand for a further increase in functions per chip, the size of the chip has, in contrast to the decreasing size of the elements, become steadily larger. As a result, the length of the wiring connecting each functional block has become greater. As a result when a transistor driving such wiring is considered, as element size is reduced, the load which is to be driven becomes larger instead of smaller, and there is even greater demand for an increase in the current driving capacity of the elements.

Transistors which drive large loads as described above require extremely large current driving capacities, and as shown in Formula (1), it is necessary that the channel width W have a large value from a few tens of μm to a few hundred μm. In particular, it is necessary that the transistors used in the output stage to the output circuit to the external circuitry have extremely large channel widths W.

A conventional transistor structure is shown in FIG. 16. Here, (a) shows a plan view, (b) is a cross sectional line along the line A–A', and (c) shows a equivalent circuit to (a) and (b).

In the Figure, reference 1601 indicates a gate electrode formed from n⁺ polycrystalline silicon, references 1602 and 1603 indicate a source and a drain respectively, reference 1604 indicates a gate insulating film formed from $SiO_2$, and reference 1605 indicates a field oxide film.

In such a transistor, as shown in FIG. 16(c), the gate electrode itself is a RC distribution constant equivalent circuit, and a limited amount of time is required for the transmission of a signal from one end 1606 of the gate to the other end 1607.

Next, in FIG. 17, an equivalent circuit diagram of the transistor is shown. When the wiring connecting the source and the ground level is long, it becomes impossible to ignore the parasitic resistance $R_s$ and the parasitic inductance $L_s$. The voltage drop in the source wiring is determined by the sum of the product of the parasitic resistance and the current and the product of the time differentials of the current and the parasitic inductance. In particular, if the transistor is to be operated at high speed, the time differential of the current becomes large, and the parasitic inductance participates to a great extent in the voltage drop. Furthermore, similar problems with respect to the parasitic resistance and the parasitic inductance are present in the wiring connecting the power source line and the source.

In operating transistors at ultra high speeds, the parasitic resistance and the parasitic inductance of the source wiring presented great problems in increasing the scale of integration and operation at ultra high speeds of semiconductor devices.

FIG. 18 is a graph showing the relationship between the amplitude of the signal and the position thereof when a high frequency signal is applied from one end of the gate of the transistor shown in FIG. 16. As the signal is propagated through the gate electrode, the voltage amplitude thereof attenuates. In this way, if the resistance of the gate electrode becomes large, the high-frequency components are attenuated, and even if the gate width W is made large, effective use over the entire length thereof becomes impossible.

Furthermore, in FIG. 19, the attenuation of signals when propagated through wiring lengths of 1 nm, 2 nm, 3 nm, and 4 nm is shown. As shown in the Figure, when an ultra high speed signal is propagated along wiring, power consumption is caused within the silicon substrate by the electric field components in the direction of propagation of the signal, so that dramatic waveform attenuation occurs. In this manner, in conventional transistors, the waveform of high speed signals propagated along the wiring broke down, and this represented a great barrier to high speed operation.

Furthermore, an example of a formation method for an LDD structure, which is commonly employed as a counter measure to the strong electric field in the region of the drain which has been noted to be a factor in the deterioration of the device characteristics accompanying a great reduction in size in the elements, is shown in FIG. 20. Using a polysilicon gate as a mask, comparatively low concentration (for example, $1 \cdot 10^{13}$ cm$^{-2}$) n⁻ ion implantation is conducted, and then a CVD $SiO_2$ film is deposited. Thereafter, a side wall is formed by means of isotropic mode reactive ion etching, and source/drain ion implantation is conducted. In this structure, a trade off relationship existed between the effect of a reduction in the electric field in the vicinity of the drain and a reduction in the current driving capacity as a result of the parasitic resistance of the n⁻ layer.

As described above, a transistor having a larger current driving capacity is required in order to achieve an increase in the speed and scale of integration of devices; however, if in conventional devices, for example, the gate insulating film ($SiO_2$) was made thinner, the transistor could not be used as a result of the direct tunneling current in the insulating film. Furthermore, when transistors having a large gate width W for large current driving were employed, a limited amount of time was required to place the transistor in an on state from one end thereof to the other end, and furthermore, there was a problem in that the waveform of high speed signals propagated through the wiring broke down.

In view of the above circumstances, the present invention has as object thereof to provide a semiconductor device having a large power driving capacity and which is capable of high speed operation.

DISCLOSURE OF THE INVENTION

The semiconductor device in accordance with the present invention is characterized in that a first semiconductor region of a first conductivity type is provided on a metal substrate via a first insulating film, first source and drain regions of a second conductivity type are formed within this first semiconductor region, and furthermore, a first metallic gate electrode is formed via a second insulating film on the region which isolates the first source and drain regions.

The preferred mode of the present invention is a semiconductor device wherein the relative dielectric constant of the second insulating film is 8 or more, and the film thickness $t_I$ thereof satisfies Formula (2) below.

$$t_I(nm) < 3 \times (\epsilon_r / \epsilon_{SiO2}) \quad (2)$$

Here, $\epsilon_r$: relative dielectric constant of the second insulating film $\epsilon_{SiO2}$: relative dielectric constant of the silicon oxide $SiO_2$ film Furthermore, a preferred mode of the present invention is a semiconductor device wherein the second insulating film has a layered structure comprising an insulating film having a specific conductivity of 8 or more, and an oxide film which is thinner than the insulating film having a specific conductivity of 8 or more and which is formed by the oxidation of the semiconductor region.

Furthermore, a preferred mode of the present invention is a semiconductor device wherein the second insulating film is thicker at the metallic gate electrode end thereof, and furthermore, the first metallic gate is oxidized, and an oxide of the metal comprising the metallic gate is formed between the end of the metallic gate electrode and the second insulating film.

A further preferable mode of the present invention is a semiconductor device wherein the thickness of the first semiconductor region is within a range of 0.01–0.1 μm, and the gap between the source and drain regions is 0.25 μm or less.

In the present invention, it is preferable that the first insulating film have periodic steps.

Furthermore, a preferred mode of the present invention is a semiconductor device in which at least one of the first insulating film, the first semiconductor region, and the second insulating film is formed by means of a two frequency excitation sputtering method.

A further preferred mode of the present invention is a semiconductor device, wherein a second semiconductor region of a second conductivity type is formed on the metal substrate via the first insulating film, second source and drain regions of a first conductivity type are provided within the second semiconductor region, and the second metallic gate electrode is formed via the second insulating film on the region isolating the second source and drain regions and is connected with the first metallic gate electrode.

A further preferred mode of the present invention is a semiconductor device, characterized in that the impurity concentration in a portion of the first drain region which is adjacent to the first semiconductor region having the first conductivity type is lower than the impurity concentration in the first source region.

Furthermore, in the present invention, it is preferable that the first source region be connected to the metal substrate by means of metallic wiring.

Furthermore, in the present invention, it is preferable that the second source region be connected by means of metallic wiring with a metallic plate larger than the width of the metallic wiring which is located above the second source region, and furthermore, at least one of the metal substrate and the metallic plate be provided with a mechanism in which a fluid flows.

Function

In the present invention, by means of forming a thin semiconductor layer on the metal substrate via a first insulating film, it is possible to suppress the attenuation of the signal waveform generated when a silicon substrate is used. That is to say, by means of providing metallic wiring on the metal substrate via an insulating film, the electric field component in the direction of propagation of the signal is eliminated, and only that component which is perpendicular to the direction of propagation remains, so that the attenuation of the waveform can be avoided.

Furthermore, it is preferable that the thickness and channel length of the semiconductor region in the present invention be, respectively, within a range of 0.01–0.1 μm and 0.25 μm, and within these ranges it is possible to further suppress the attenuation of the signal waveform, and it is furthermore possible to reduce the gate delay period, so that it becomes possible to realize ultra high speed operation of, for example, 20 ps or less.

In the present invention, the metal substrate may comprise a conductive material having high conductivity, and another substance may be present beneath the substrate. The first insulating film may comprise a material having a large thermal conductivity. Furthermore, in addition to silicon, it is also possible to use wide gap semiconductors such as diamond, SiC or the like as the semiconductor film.

In the semiconductor device in accordance with the present invention, a material having a specific conductivity of 8 or more is used as the second insulating film. For example, a $Ta_2O_5$ film having a specific conductivity of 25 may be appropriately employed. By means of this, it is possible to achieve the flow of a current which is 7 times or more that in conventional devices employing $SiO_2$ as a gate oxide film. In other words, if the driving current is left unchanged, then a miniaturization to roughly ⅐ the gate surface area of a conventional transistor employing $SiO_2$ can be realized. In this manner, high current driving capacities which were not realizable using conventional transistors employing $SiO_2$ in the gate oxide films thereof can be realized by means of the present invention with an extreme reduction in element size.

In this way, if the gate capacity per surface area unit is increased, it is possible to increase the current driving capacity of the transistor. Employing an insulating film having a large dielectric constant is the same as equivalently reducing the thickness of the $SiO_2$ film. Thus the equivalent oxide film thickness ($SiO_2$ conversion) t' when an insulating film having a large dielectric constant is employed will be defined.

$$t'=t_f(nm)\times(\epsilon_{SiO_2}/\epsilon_r) \qquad (3)$$

Here, $t_f$: thickness of the gate insulating film $\epsilon_r$: relative dielectric constant of the first insulating film $\epsilon_{SiO_2}$: relative dielectric constant of the silicon oxide film If t'<3 nm, then a high current driving capacity which was not realizable with transistors employing $SiO_2$ gate oxide films will be obtained. If the thickness of the gate oxide film satisfies the conditions shown in Formula 2, then a high current driving capacity which was not realizable using conventional semiconductor devices can be realized.

Furthermore, when the relative dielectric constant of the gate insulating film is 8 or more, then in order to cause the flow of a current identical to that in a conventional transistor employing $SiO_2$ at a film thickness of 3 nm, the thickness of the gate oxide film may be 6 nm or more. Since the current leakage resulting from the direct tunnelling phenomenon decreases exponentially with respect to film thickness, a gate insulating film of 6 nm or more possesses a sufficient margin of thickness with respect to the current leakage caused by the direct tunneling phenomenon. Accordingly, it is possible to increase the reliability of the transistor.

Concrete examples of the second insulating film described above include, for example, $Ta_2O_5$, $TiO_2$, $Al_2O_3$, and the like. These insulating films can be formed by oxidation after the formation of a metallic film, or can be directly formed as oxide films.

Furthermore, in the present invention, it is preferable that the second insulating film have a layered structure of an insulating film having a relative dielectric constant of 8 or more, and an oxide film of the semiconductor. By forming a layer having a large relative dielectric constant on the oxide film of the semiconductor, it is possible to reduce the interface state density of the semiconductor, and it is possible to drive a larger current. However, it is necessary to reduce the thickness of the oxide film so that it is thinner than that of the insulating film having a relative dielectric constant of 8 or more.

Furthermore, it is preferable that the insulating film beneath the ends of the metallic gate electrode be thicker than in the central portion thereof. By means of this, a voltage concentration effect can be prevented, and it is possible to increase the dielectric strength.

In the present invention, a metal having a small resistivity is employed as the gate electrode. For example, by means of employing Al, it is possible to greatly suppress the signal amplitude attenuation. Accordingly, by means of employing a Al electrode it is possible to conduct driving over the entire gate width.

In the present invention, steps are provided in the surface of the first insulating film which have a precision on the order of angstroms and which serve as kernels for silicon growth. By means of selecting the intervals and shapes of the steps, it is possible to orient the direction of in-surface rotation of the silicon crystalline grains, and silicon monocrystals of higher quality can be obtained. That is to say, if a silicon film having oriented directions of rotation covers the surface of the first insulating film, subsequent silicon atoms will be deposited in a manner guided by the underlying layer, and a monocrystal silicon layer will be formed. At this time, the optimal migration energy is applied to the silicon atoms as a result of the effects of low energy ion irradiation, and it is thus possible to obtain a monocrystalline film having no minute crystalline defects. A still higher quality silicon crystal can be obtained by arranging the steps described above having sizes within a range of 0.5–5.0 nm at intervals of 0.2–5.0 µm. It is preferable that the material used in the first insulating film have a high thermal conductivity, and AlN is particularly preferable. By means of employing AlN having a high thermal conductivity on the metal substrate, it is possible to immediately externally dissipate the heat which is generated by the transistors, and as a result, it is possible to reduce the thermal noise level, and to increase the reliability of circuit operation.

It is possible to employ various vacuum film formation methods in forming the first and second insulating films and the semiconductor film of the present invention; however, from the point of view of the minuteness and monocrystalline nature of the film, a two frequency excitation plasma processing apparatus can be particularly advantageously employed.

Furthermore, in the present invention, the use of a CMOS structure as the circuit pattern is preferable, and by means of this, it is possible to increase the noise margin even with respect to a decline in power voltage. Furthermore, the heat generated in the CMOS as a result of ultra high speed operation is rapidly externally dissipated via the AlN insulating film having a high thermal conductivity which is provided on the metal substrate, and via the metal substrate, as described above. In this way, the thermal noise level which represents the theoretical noise limit can be reduced, and the reliability of circuit operations is improved. By designing the transistors and wiring using such a structure, it is possible to achieve high speed operations wherein the clock rate is in excess of 1 GHz.

BRIEF DESCRIPTION OF THE DRAWINGS

FIGS. 3(a) and 3(b) are images of the surface of various insulating films in which a monocrystalline silicon layer was grown.

FIG. 4 is a graph showing the relationship between the drain voltage and the drain current normalized by the gate length L and gate width W of a transistor in accordance with Embodiment 1.

FIG. 9 is a schematic cross sectional view of a semiconductor device in accordance with a fourth Embodiment of the present invention.

FIG. 17 is an equivalent circuit diagram of a conventional transistor.

DESCRIPTION OF THE REFERENCES

101 Cu substrate,
102 AlN insulating film,
103 monocrystalline silicon layer,
104 gate oxide film,
105 gate electrode,
106 Al wiring,
107 two frequency excitation plasma processing chamber,
108 target,
109 sample,
110 gas input port,
111 vacuum exhaust system,
112 RF electrode,
113 matching circuit,
114 shield,
201 thin silicon film,
202 $Ta_2O_5$ film,
203 $SiO_2$ film,
301 drain,
302 Al gate electrode,
303 $Ta_2O_5$,
304 end portion of gate electrode,
305 flat portion.

BEST MODE FOR CARRYING OUT THE INVENTION (Embodiment 1)

Figure 1:
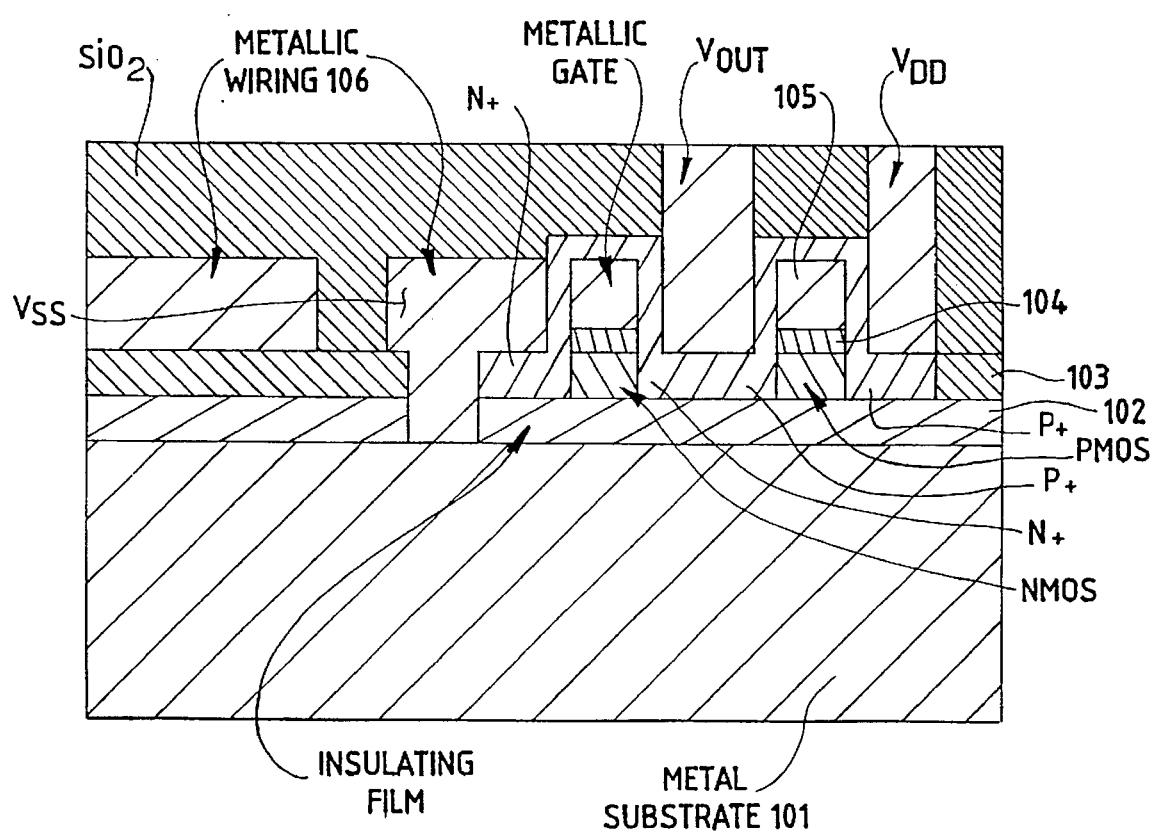
FIG. 1 is a schematic cross 1 view of a semiconductor device showing the first Embodiment.

FIG. 1 is a cross sectional view of a semiconductor device showing a first Embodiment of the present invention. In the present Embodiment, an AlN (thermal conductivity: 180 W/mK) insulating film (first insulating film) 102 is formed on a Cu substrate 101, and on top of this, a monocrystalline silicon layer 103 is deposited and an inverter circuit having a CMOS structure is thus produced. A gate oxide film (second insulating film) 104 comprises $Ta_2O_5$ (relative dielectric constant: 25) having a thickness of 5 nm, and gate electrode 105 comprises Al. Furthermore, the Al wiring 106 connecting the source and drain regions with the gate electrode is isolated from other semiconductor regions via an insulating film.

Figure 2:
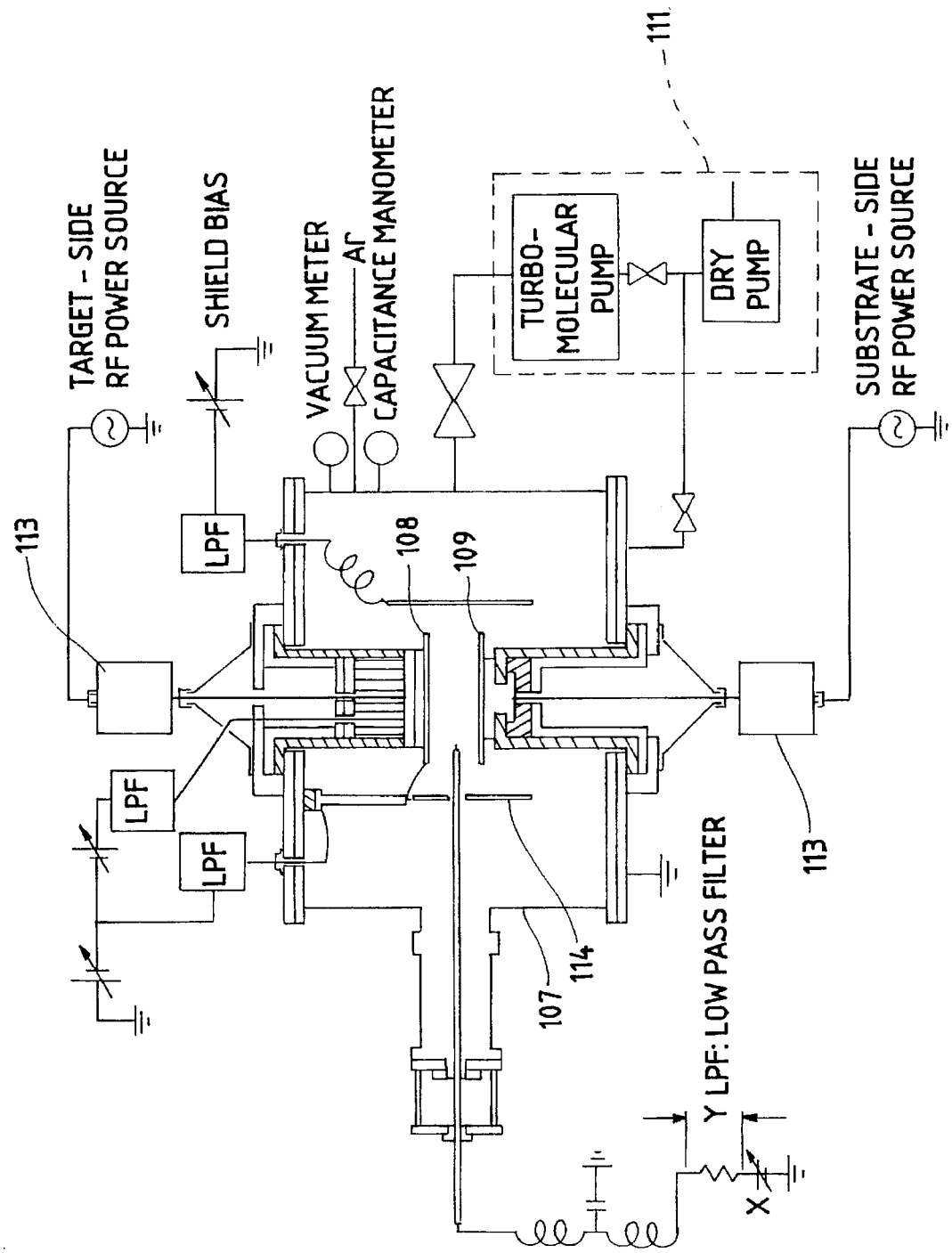
FIG. 2 is a schematic view of a two frequency excitation plasma processing apparatus.

Insulating film 102, monocrystalline layer 103, gate oxide film 104, and gate electrode 105 are deposited in that order using a two frequency excitation plasma processing apparatus. In FIG. 2, a schematic view of a two frequency excitation plasma processing apparatus is shown. The present apparatus is provided, within chamber 107, with a target 108 and a sample attachment portion which is disposed so as to be parallel to target 108, and is also provided with a gas input port 110 and a vacuum exhaust system 111. Furthermore, RF power sources 112 which are used in plasma discharge are independently connected to target 108 and sample 109 via matching circuits 113, and it is possible to control the self-bias of sample 109. Furthermore, shields 114 are provided as as to enclose the electrodes, and by means of applying an external bias, the potential of the shields can be controlled. Vacuum exhaust system 111 comprises an oil-free magnetic levitation type turbo-molecular pump and a dry pump; the attained vacuum degree within chamber 107 reaches an ultra high vacuum degree on the level of $10^{-10}$. Ultra pure argon gas is supplied through gas input port 110.

Figure 3B:
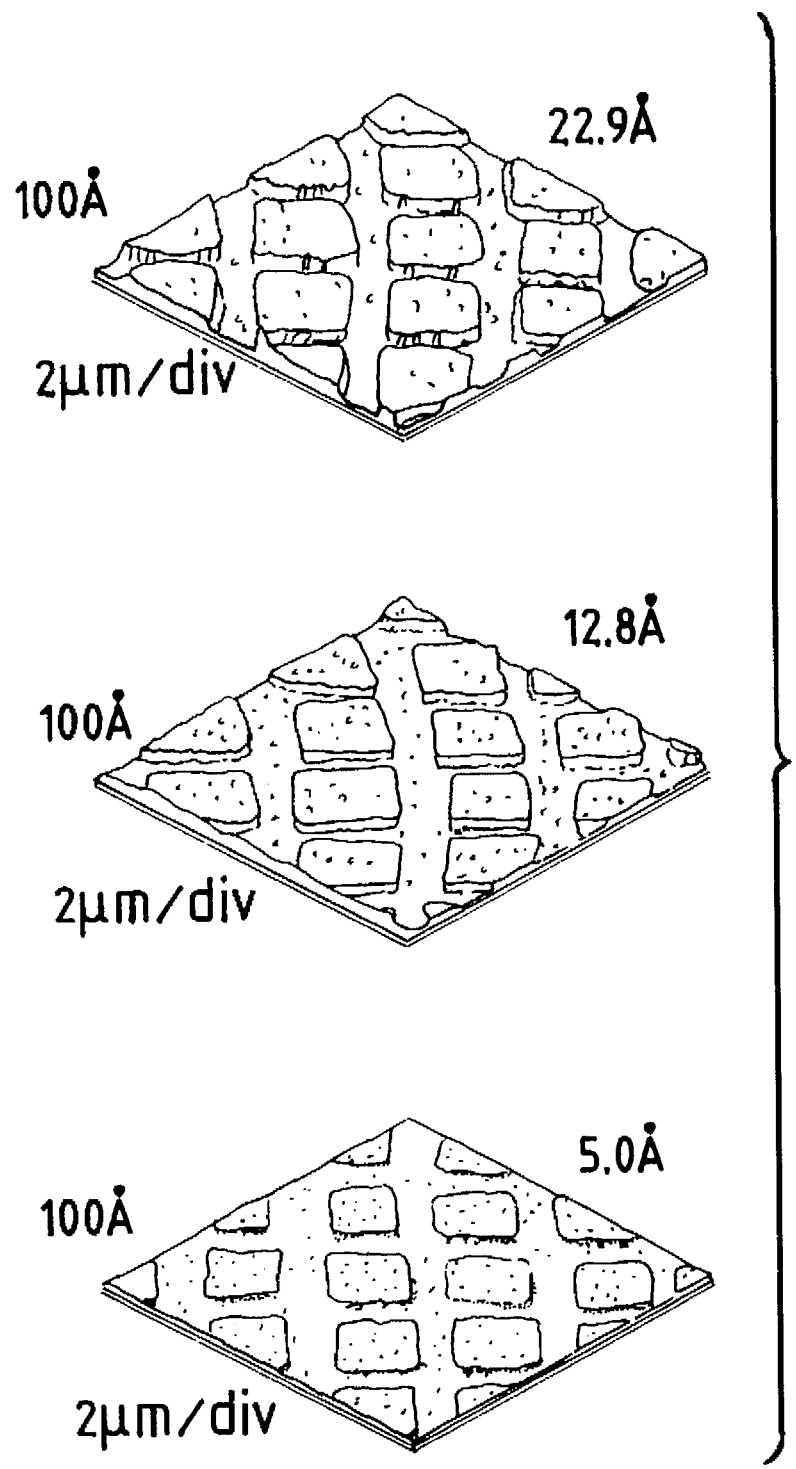

First, a 200 nm AlN film was formed on the Cu substrate as the first insulating film, and steps arranged at intervals were formed by forming 2×2 μm projections having varying heights (0.5–11.4 nm) at gaps of 1 μm by means of wet etching. Images of the surface of the AlN film are shown in FIG. 3. A high resolution inter-atomic force microscope capable of observations in an ultra high purity gas and an ultra high vacuum was used for the observation of the form of the steps on an atomic level.

Next, 0.01–0.1 μm of crystalline silicon was formed. The crystalline silicon film obtained was a monocrystalline film which was minute and had no crystalline flaws.

The formation of a monocrystalline silicon layer is thought to occur because, by means of the formation of the steps described above, a single silicon film in which the directions of rotation are oriented covers the surface of the insulating film, and the succeeding silicon atoms are deposited in such a manner as to be guided by the atoms below. It is thought that at this time, the optimal migration energy is applied to the silicon atoms by means of the low energy ion irradiation effect, and a monocrystalline film which is minute and has no crystal defects is obtained. In the present Embodiment, monocrystals having fewer defects can be obtained when the steps are within a range of 0.5–5.0 nm.

A $Ta_2O_5$ insulating film was formed on the monocrystalline silicon film 103 described above, and next 0.5 μm of Al was formed, then the patterning of the gate electrode and the pattering of the source and drain were conducted, and the source and drain were formed by ion implantation, and thus a sample MOS type transistor was produced. In the present Embodiment, the formation of the source/drain regions by means of ion implantation employed the Al gate electrode as a mask, and was performed in a self-matching manner. The annealing of the ion implantation layer was conducted at a low temperature of 450° C. Furthermore, an ultra clean ion implantation apparatus was employed, in which the apparatus had a vacuum degree higher than $10^{-9}$ Torr, and which was designed so that the contamination resulting from the sputtering of the chamber metallic material as a result of the ion beam was kept at a sufficiently low level.

FIG. 4 shows the relationship between the drain voltage and the drain current normalized by the gate length L and the gate width W. It can be seen that with respect to identical voltage application conditions, the transistor of the present invention permits the flow of a current which is in actuality 7 times greater than that of the conventional transistor, which employed $SiO_2$ as a gate oxide film. This corresponds to the fact that the dielectric constant of the gate voltage, which is 3.9 in the case of $SiO_2$, is roughly 7 times that in the case of the $Ta_2O_5$ of the present invention. That is to say, the dielectric constant is roughly 7 times greater, so that the gate capacity per unit of surface area is roughly 7 times greater, the channel carrier density which can be caused by the same voltage is also 7 times greater, and the current which flows is 7 times greater as well. In other words, if the driving current is left unchanged, a reduction in size of the gate surface area to roughly ⅐ that in the case of conventional transistors employing $SiO_2$ can be realized. The choice of such a material is appropriate for the maximum possible reduction in the dimensions of the device, which most greatly influences the ability to achieve ultra high performance. In conventional $SiO_2$ gate oxide films, it is known that when the thickness was 3 nm or less, current leakage, termed the direct tunneling current, occurred. Accordingly, in conventional semiconductor devices employing $SiO_2$ in the gate oxide film, the extreme reduction in size necessary to realize ultra high performance devices was impeded. Putting it in opposite terms, high current driving capacities and extreme reductions in element size which were impossible in conventional transistors employing $SiO_2$ in the gate oxide film are realizable by means of the present invention.

Figure 5:
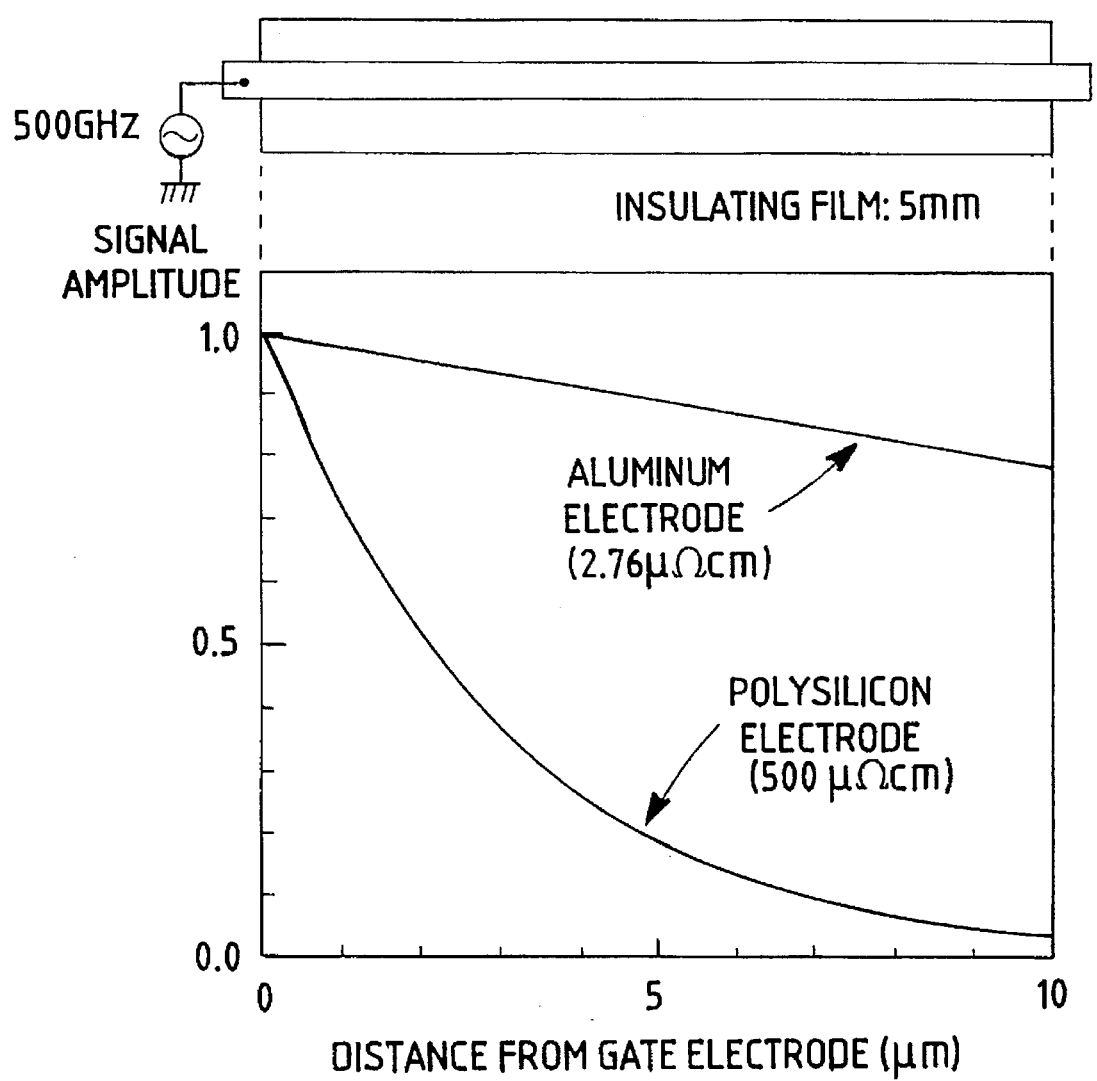
FIG. 5 is a graph showing the state of the attenuation in the signal amplitude when a high frequency signal is inputted from one end of the gate.

In FIG. 5, the state of the attenuation of the signal amplitude in the case in which a high frequency signal is inputted from one end of the gate electrode is shown in comparison to that in the case of conventional polycrystalline silicon electrodes and Al electrodes. In the case of the polycrystalline silicon electrode, which has a large resistance, the signal amplitude is markedly attenuated, while in contrast, relatively little attenuation is observed in the case of the Al electrode. Accordingly, by using Al electrodes, it is possible to conduct driving over the entirety of the gate width.

Figure 6:
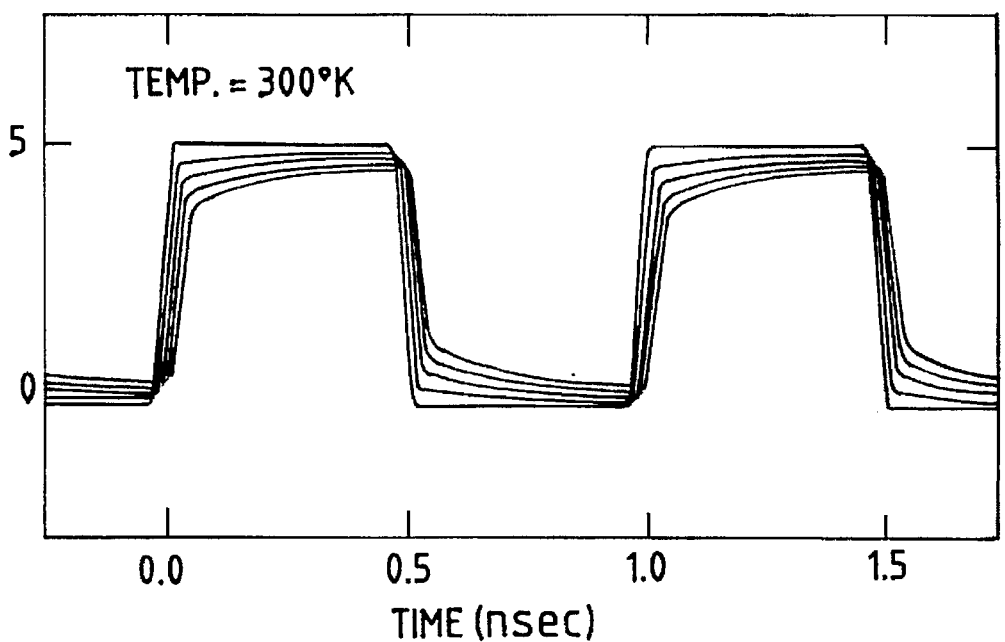
FIG. 6 is a graph showing the deterioration in the pulse waveform when propagated at normal temperatures through wiring provided on the metal substrate via an insulating film in accordance with the present invention.

FIG. 6 shows the deterioration in the pulse waveform when propagated, at normal temperatures, through wiring provided on the metal substrate via an insulating film. The attenuation in the signal waveform generated when a silicon substrate is employed is practically non-existent when a metal substrate is employed. That is to say, by means of providing the metallic wiring on a metal substrate via an insulating film, the electric field component in the direction of propagation of the signal is eliminated, and only that component which is perpendicular to the direction of propagation remains, so that the attenuation of the waveform is avoided.

Furthermore, in the present Embodiment, it was confirmed that, using an MOSFET having a channel length of 0.25 μm or less, by means of setting the Si thickness to 0.06 μm, ultra high speed operation in which the gate delay period was 20 ps or less could be realized.

(Embodiment 2)

Figure 7A:
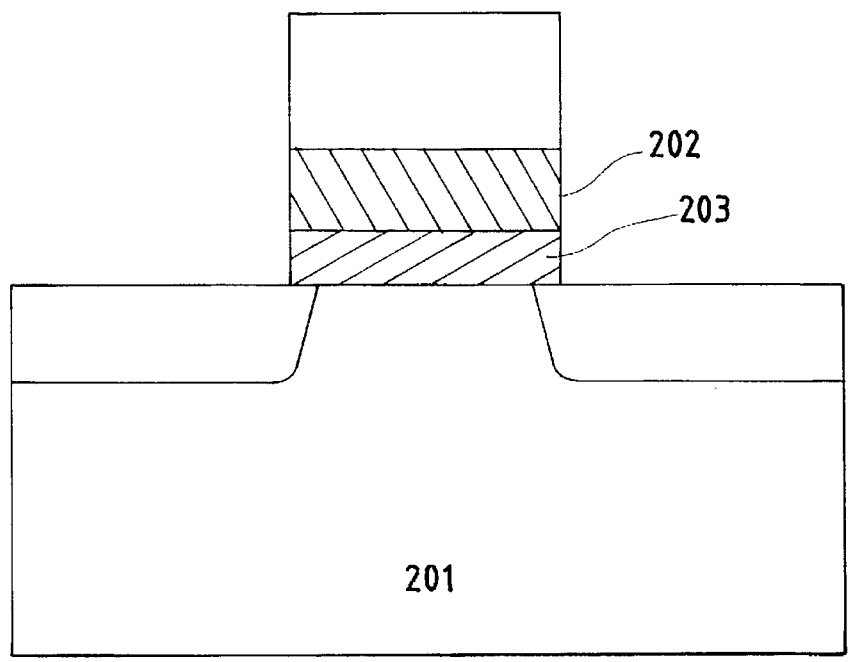
FIG. 7(a) and 7(b) relates to a second Embodiment; 7(a) is a schematic cross sectional view of the semiconductor device, while 7(b) is a graph showing the difference in surface level resulting from the presence or absence of $SiO_2$.

FIG. 7 shows a second Embodiment of the present invention. FIG. 7(a) shows a cross sectional view of a semiconductor device in accordance with the present Embodiment. A $SiO_2$ film 203 which is formed by the oxidation of the substrate Si is interposed between the thin silicon film 201 and the $Ta_2O_5$ film 202 which comprises the first gate insulating film.

The formation of the $SiO_2$ film 203 is conducted in an oxidizing atmosphere at a temperature of 300° C. Next, using the two frequency excitation plasma processing apparatus shown in FIG. 2, a film of the metal Ta is formed by means of the bias sputtering method, and thereinafter, direct oxidation is conducted in an continuous manner while maintaining the vacuum state, and the $Ta_2O_5$ film 202 is formed. Other points were identical to those in Embodiment 1, and a CMOS inverter was produced.

The surface between the thin silicon layer and the gate insulating film corresponds to the channel region through which the current flows, so that the surface characteristics thereof affect the device characteristics of the semiconductor device. For example, if the interface state density is large, the carrier within the channel is subject to scattering, and the mobility is reduced. A reduction in mobility brings about a decline in current driving capacity. Accordingly, the interface state density must be suppressed so as to be as small as possible.

Figure 7B:
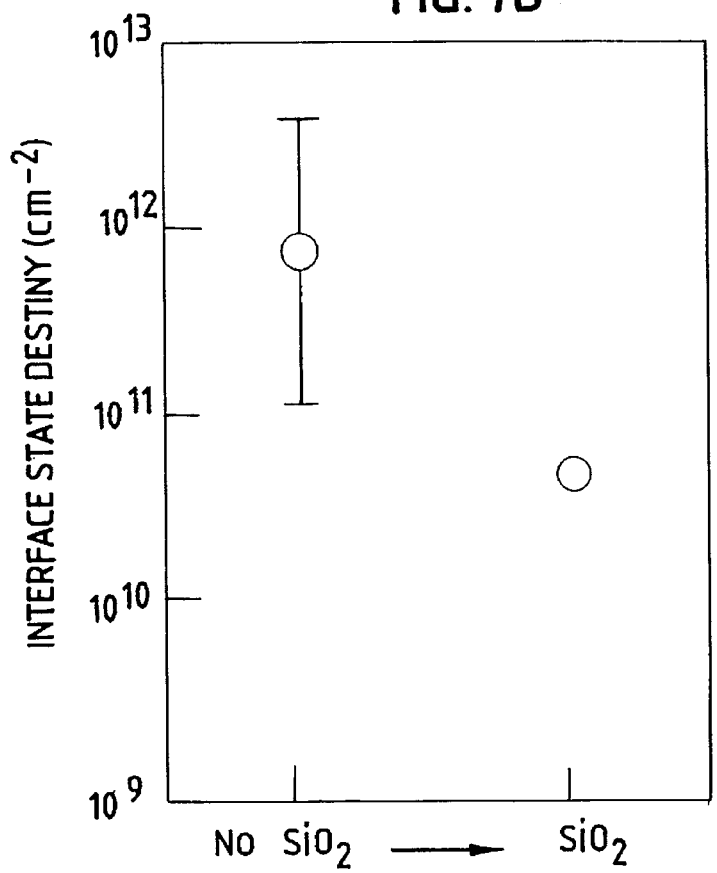

FIG. 7(b) shows the difference in the interface state density resulting from the presence or absence of the $SiO_2$ film 203. The interface state density is smaller ($\sim 5 \times 10^{16}$ cm$^{-2}$) in the case in which the $SiO_2$ film is provided, as in the present Embodiment, in comparison with the case in which there is no $SiO_2$ film; furthermore, the variation in this value is also reduced.

However, when the $SiO_2$ film 203 becomes thick, then the gate capacity, which is determined by the serial composite capacity with the $Ta_2O_5$ film 202, becomes smaller, and the high dielectric gate insulating film effect is reduced, so that it is necessary that the $SiO_2$ film 203 be thinner than the $Ta_2O_5$ film 202, which comprises the first gate insulating film.

(Embodiment 3)

FIG. 8 shows a third Embodiment of the present invention.

Figure 8A:
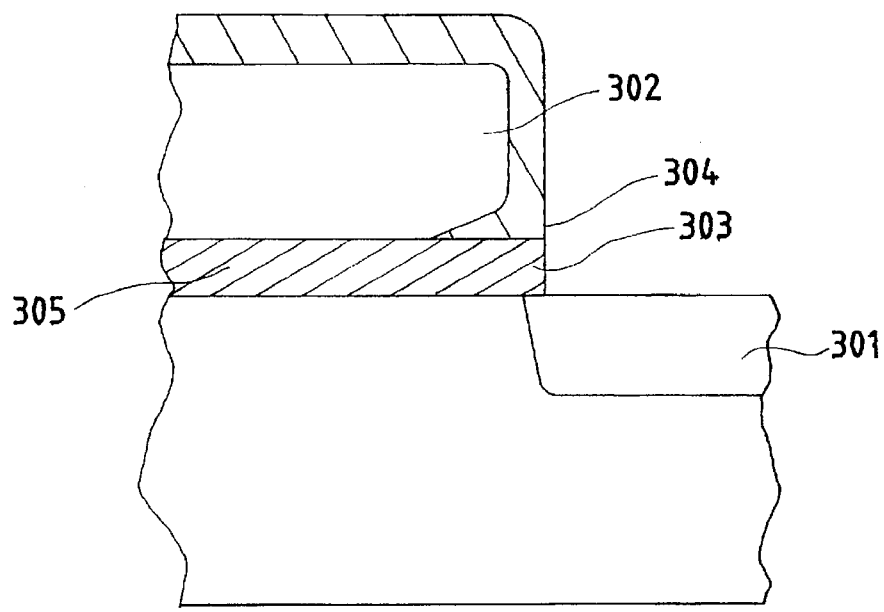
FIGS. 8(a) and 8(b) relate to a third Embodiment; 8(a) is a schematic cross sectional view of the end portion of the gate electrode of the semiconductor device, while 8(b) is a graph showing the relationship between the thickness of the oxide film and the gate insulating film dielectric strength characteristics after formation by means of an anodic oxidation method.

In FIG. 8(a), a cross sectional view of a portion of a gate electrode is shown. In the present Embodiment, reference 301 indicates a drain, reference 302 indicates a Al gate electrode, and reference 303 indicates $Ta_2O_5$. After the ion implantation and annealing of the source and the drain, the surface of the Al gate electrode is post-oxidized by means of the anodic oxidation method. By means of this post-oxidation, the oxide $Al_2O_3$ of Al invades the end portion 304 of the gate electrode, and the thickness of the gate insulating film at this portion is thus thicker than that of the flat portion 305.

Figure 8B:
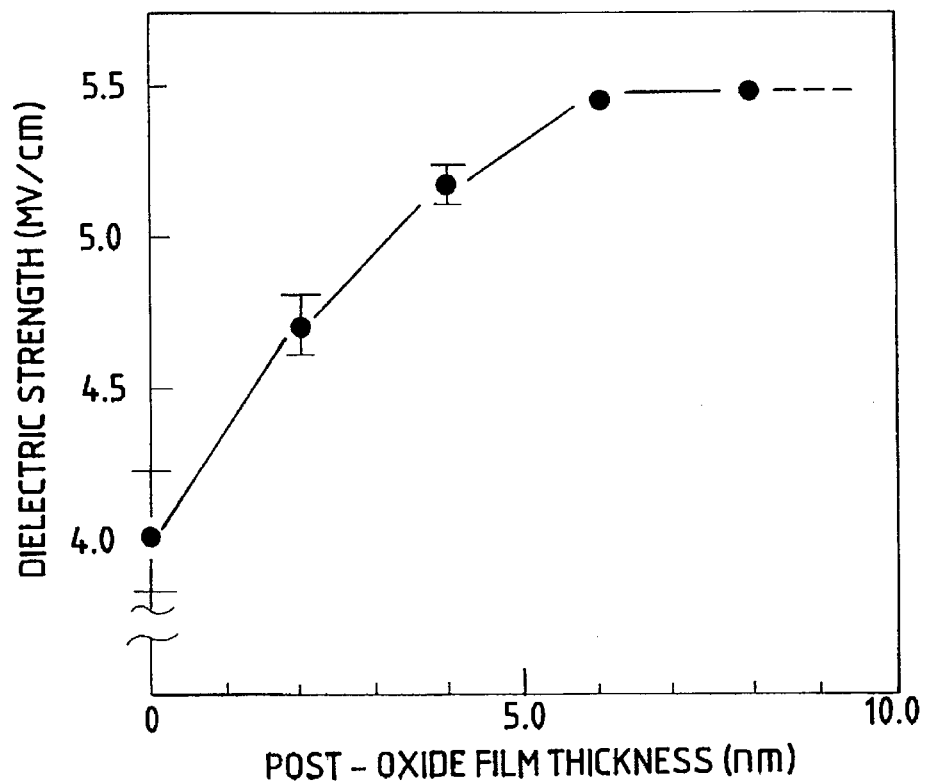

In FIG. 8(b), the relationship between the post-oxide film thickness formed by the anodic oxidation method and the dielectric strength of the gate insulating film is shown. When the thickness of the post-oxide film is 0, that is to say, when post-oxidation is not conducted, the dielectric strength of the gate insulating film is on the level of 4 MV/cm, while as post-oxidation is conducted, and the film thickness is increased, the dielectric strength characteristics improve. An upper limit to the improvement in dielectric strength characteristics is seen at the point at which the post-oxide film has a thickness of 5 nm, which is essentially identical to that of the gate insulating film $Ta_2O_5$. The dielectric strength at this time, roughly 5.5 MV/cm, could be said to be the intrinsic dielectric strength of the $Ta_2O_5$ which is employed here. That is to say, the field concentration effect at the end of the gate electrode (the end effect) can be completely prevented.

In the present Embodiment, $Ta_2O_5$ was employed as the first gate insulating film (second insulating film) 303; however, it is of course the case that $Al_2O_3$ or the like is also acceptable. Furthermore, $Al_2O_3$ which was produced by the anodic oxidation of the Al gate electrode was used as the post oxide film; however, other insulating films or insulating film formation methods may be employed in so far as they permit an increase in the thickness of the insulating film at the end of the gate electrode.

(Embodiment 4)

FIG. 9 shows a fourth Embodiment of the present invention. References 903 and 905 indicate, respectively, the source and the drain, reference 904 indicates an LDD region, reference 901 indicates the Al electrode, and reference 902 indicates a $Ta_2O_5$ film. In the present Embodiment, an LDD structure was formed only in the drain portion.

Figure 10:
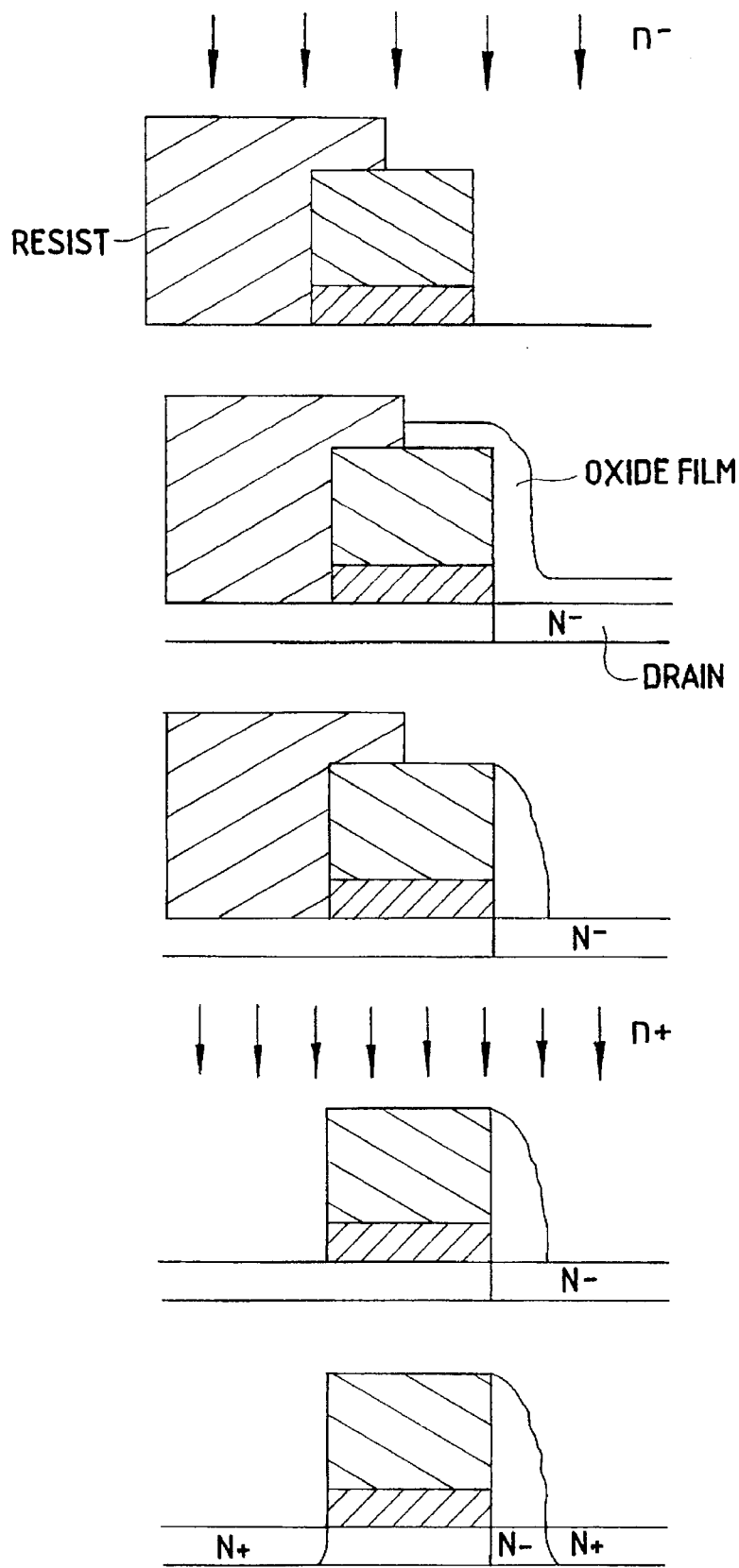
FIG. 10 is a schematic cross sectional view showing the manufacturing steps of the semiconductor device of FIG. 9.

An example of the realization of such a structure is shown in FIG. 10. First, a resist layer in which a hole was opened only at the drain region was formed by means of a lithography process. Next, an oxide film was formed only at the drain region at which the hole was opened, and a side wall was formed at only the drain portion by means of isotropic mode reactive ion etching. The resist was removed, and source/drain ion implantation was conducted.

In the present Embodiment, it was discovered that selective oxide film deposition in which deposition did not occur on the surface of the resist proceeded in the liquid phase in accordance with the reaction formula given below.

[Chemical Formula 1]

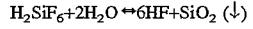

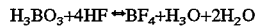

Figure 11:
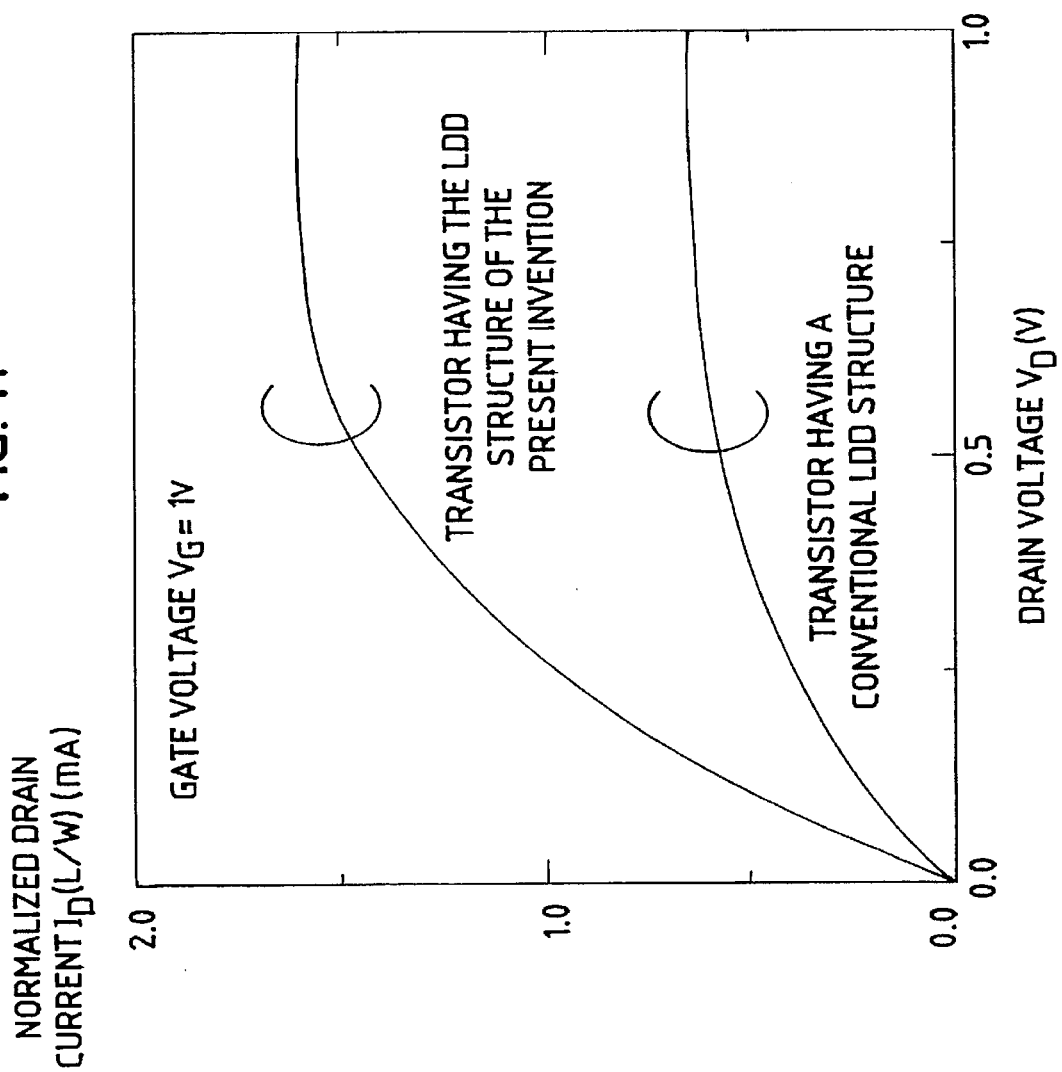
FIG. 11 shows the drain voltage/current characteristics normalized by gate length L and gate width W.

FIG. 11 shows the drain voltage/current characteristics normalized by gate length L and gate width W. It was determined that at identical drain voltages, in the transistor in accordance with the present invention having a LDD structure only at the drain region, roughly 2 times the amount of current flowed in comparison with a conventional transistor possessing an LDD structure. This indicates that since the parasitic resistance in the low concentration layer in the source region which was present in the conventional LDD structure did not exist in the transistor of the present invention, the voltage drop in the source region was eliminated, and a high current driving capacity was attained. Furthermore, with respect to the dielectric strength, the effects obtained were essentially identical to those obtained using the conventional LDD structure.

That is to say, in the transistor in accordance with the present invention, the parasitic resistance in the source region was reduced, and there was a sufficient electric field reduction effect in the vicinity of the drain, and thereby, it was possible to realize high reliability and a high current driving capacity.

(Embodiment 5)

Figure 12:
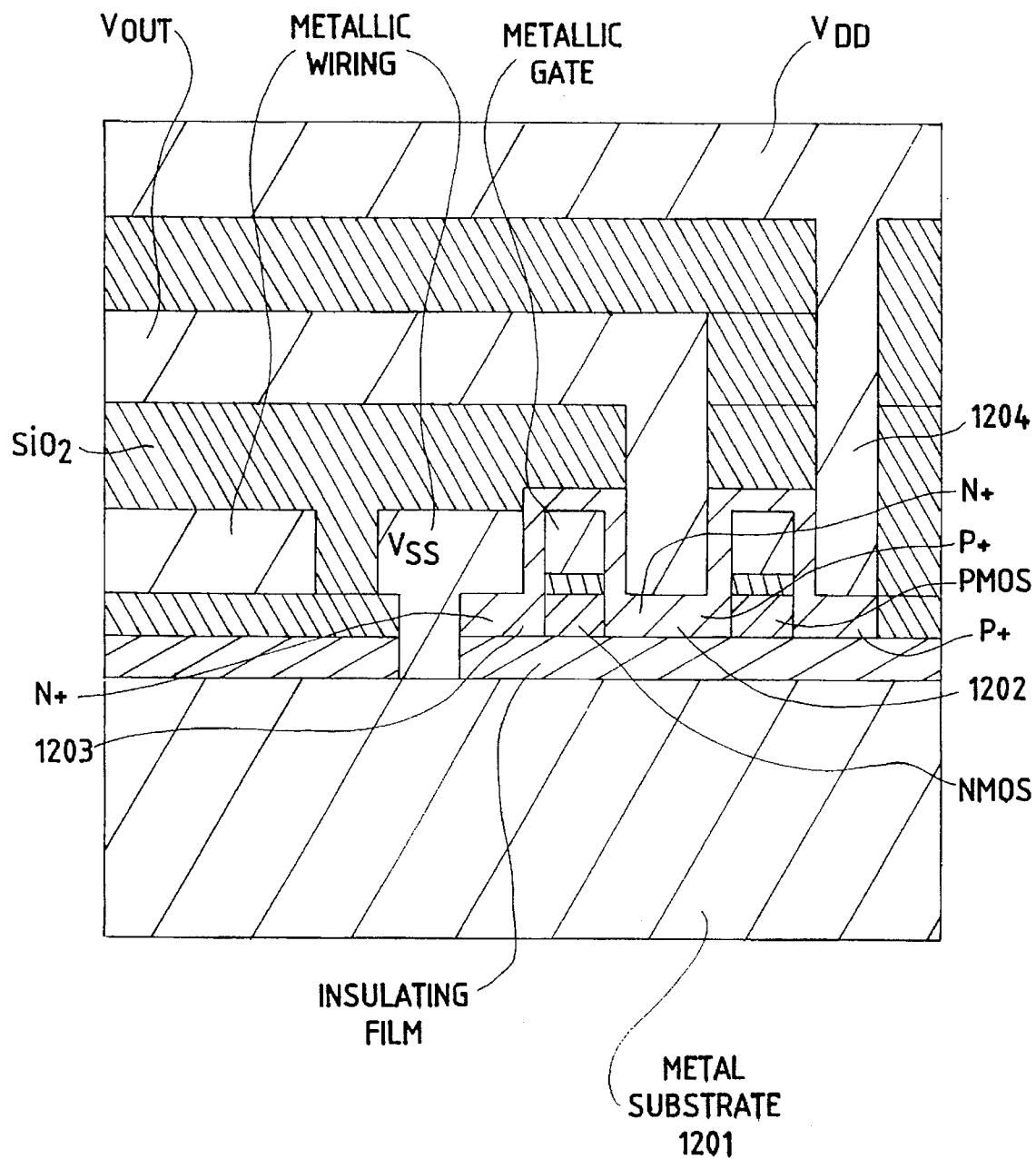
FIG. 12 is a schematic cross sectional view of a semiconductor device in accordance with a fifth Embodiment of the present invention.

FIG. 12 shows a fifth Embodiment of the present invention. In the present Embodiment, the source 1203 of an n type MOS transistor is connected with the Cu substrate 1201 which is immediately below it, and furthermore, the source 1202 of a p type MOS transistor is connected with the Cu wiring 1204 immediately above it, and thus an inverter circuit having an CMOS structure is produced. An explanation of other details is omitted here, as these details are identical to those in the first Embodiment. Cu substrate 1201 is grounded, and furthermore, the Cu wiring 1204 is connected to a power source voltage. In this case, the surface area of this Cu wiring 1204 was set to ⅔ of that of the chip surface area.

In the case of NMOS, parasitic resistance $R_{Sn}$ and parasitic inductance $L_{sn}$ are present as a result of the long and thin source wiring. If the current flowing into the drain is represented by $I_D$, the voltage between the gate and source is represented by $V_{Gs}$, and the mutual conductance of the transistors is represented by $G_m$, then the current $I_D'$ which actually flows is given by the formula below.

[Mathematical Formula 1]
$$I_D' = \frac{I_D}{1 + G_m \left( R_{Sn} + L_{Sn} \frac{1}{I_D} \frac{dI_D}{dt} \right)}$$

In this way, when a resistance or an inductance is connected to the source of the MOS transistor, and particularly in the case of high-speed operations, a dramatic voltage drop occurs, and the current traveling through the channel region becomes undesirably small. Furthermore, this is identical in the case of the PMOS. When a current is passed through wiring which is narrow and long, the parasitic resistance and parasitic inductance effects occur strongly, so that a voltage effect occurs in the source wiring, and the current driving capacity of the transistor decreases. Accordingly, the source wiring must be as short as possible and must be connected to a low-resistance metal plate having a large surface area.

Figure 13:
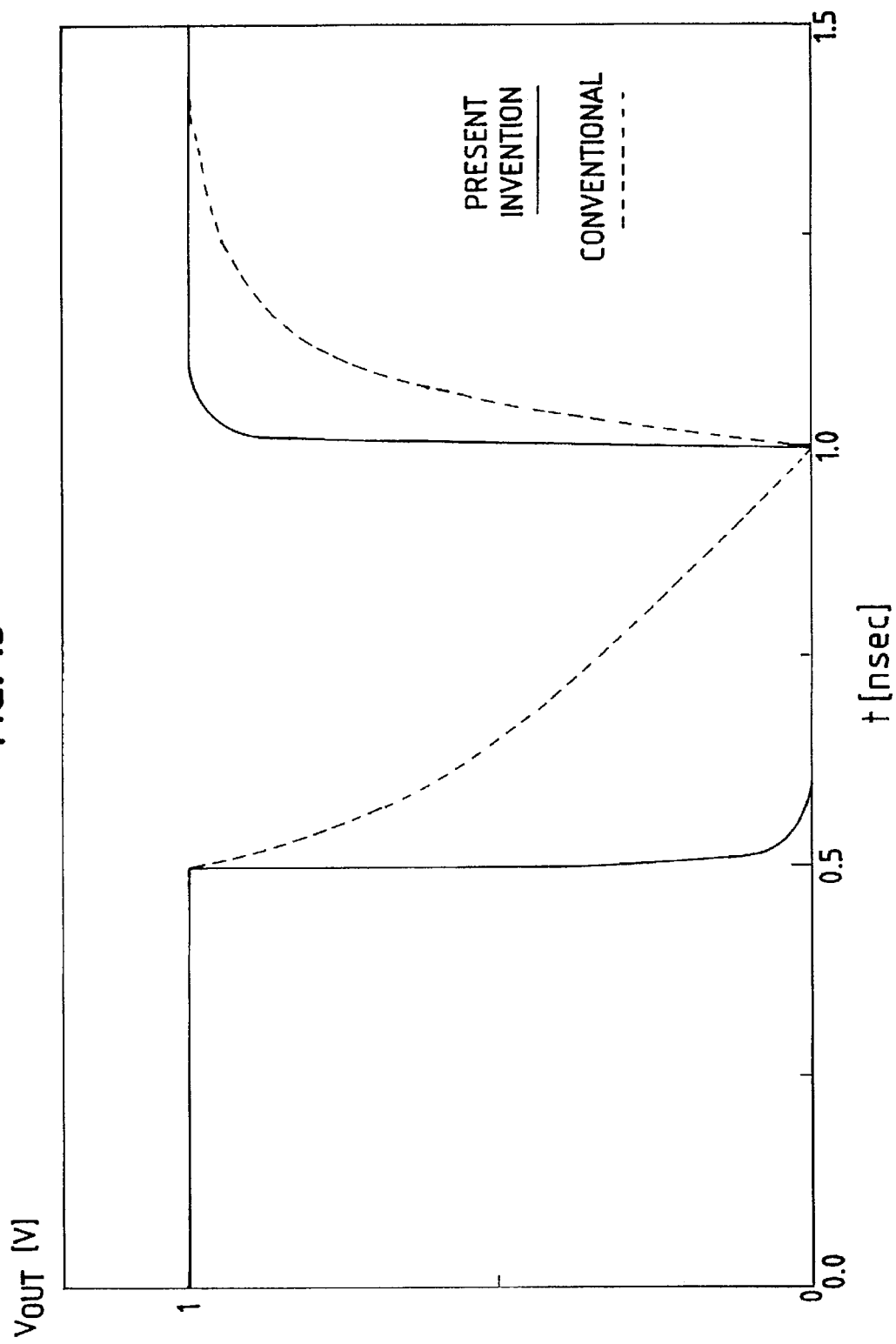
FIG. 13 shows the output voltage waveform of the switching operation of a CMOS inverter in accordance with the present invention.

FIG. 13 shows the output voltage waveform of a switching operation of the CMOS inverter in the present Embodiment. With respect to identical inputted voltage waveforms, using the transistor in accordance with the present invention, a nearly ideal output waveform is obtained, in comparison with that of a conventional transistor such as that shown in FIG. 9, in which the dotted line indicates the source wiring. This indicates that in the conventional transistor, the parasitic resistance and parasitic inductance in the source wiring cannot be ignored, and the actual current driving capacity is reduced, whereas in the transistor in accordance with the present invention, the parasitic resistance and parasitic inductance present in the source wiring can be ignored, and a high current driving capacity can be realized. That is to say, by means of the transistor in accordance with the present invention, a high current driving capacity is attained, and the delay period of the switching operation is reduced to as small a value as possible.

(Embodiment 6)

Figure 14:
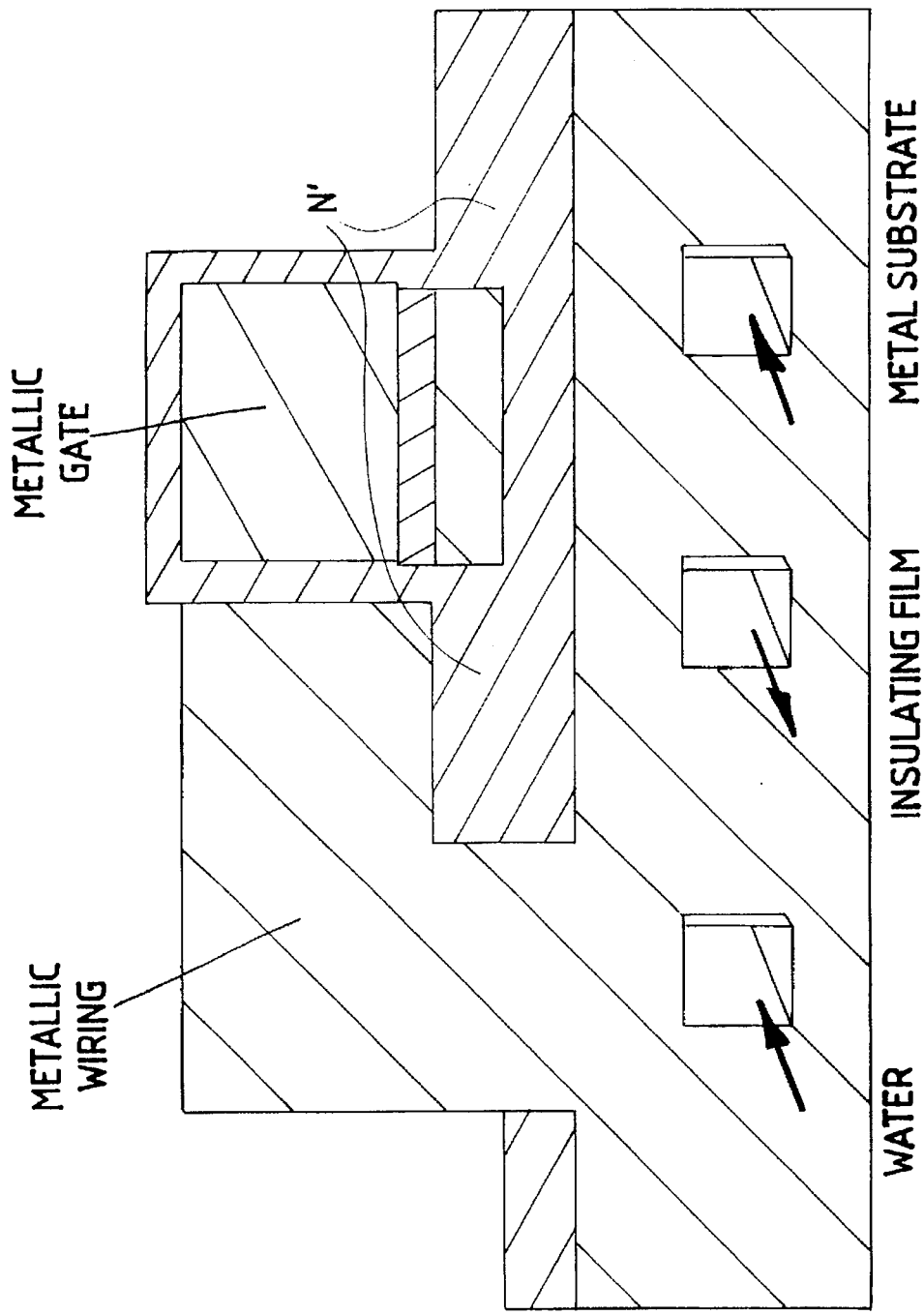
FIG. 14 is a schematic cross sectional view of a semiconductor device showing a sixth Embodiment of the present invention.

FIG. 14 shows a cross-sectional view of a semiconductor device showing a sixth Embodiment of the present invention. Grooves through which water flows are incorporated within the metal substrate. The flow rate of the water is set at 6 m/sec, 200 grooves are present within a 2×2 cm chip, and the size of the grooves is 5 μm square.

Other details were identical to those in the first Embodiment, and production was conducted. In the present Embodiment, water was used as the cooling agent; however, methyl alcohol or acetone, for example, may also be used. Furthermore, the shape or structure of the grooves may be altered as long as there is a cooling effect.

Figure 15:
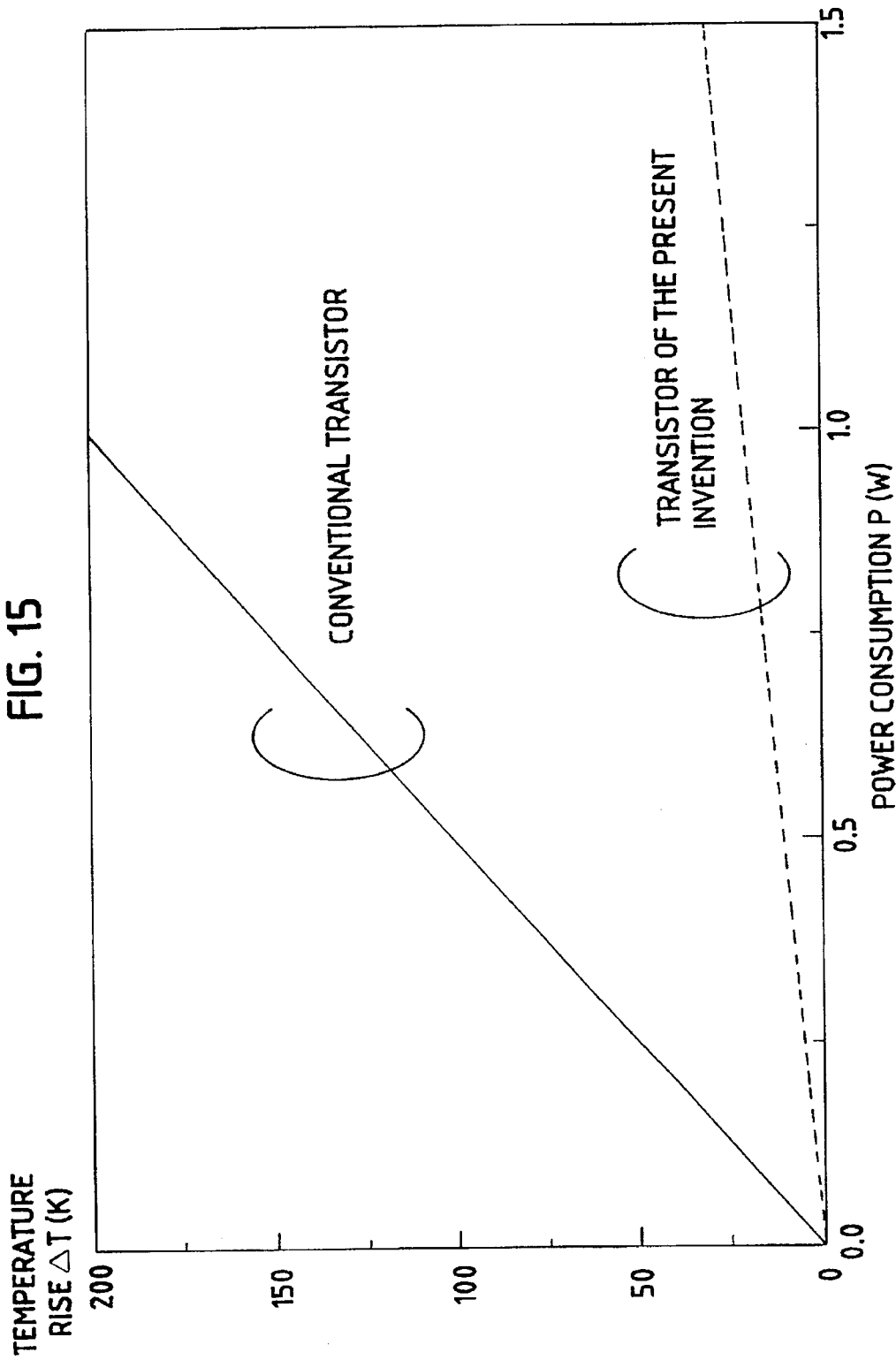
FIG. 15 is a graph showing the relationship between power consumption and temperature rise as measured using an IC chip having a surface area of 2×2 cm produced using the semiconductor device in accordance with the present invention.
Figure 16A:
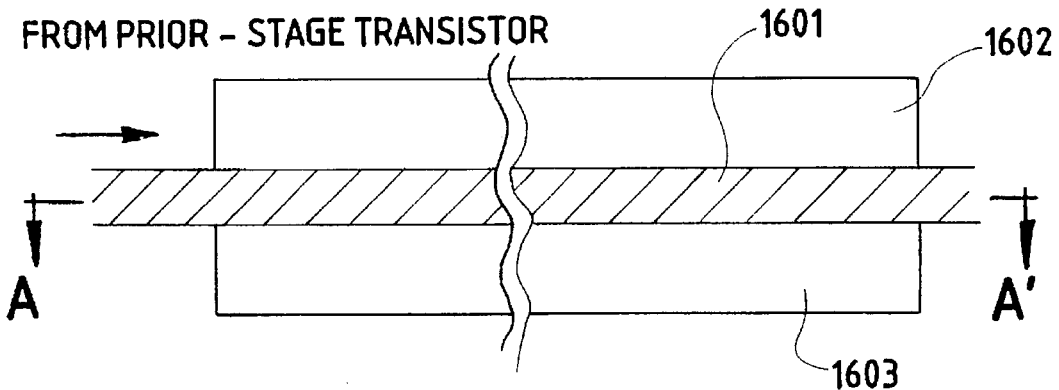
FIGS. 16(a)–16(c) show schematic views of a conventional semiconductor device; 16(a) shows a plan view, 16(b) shows a cross sectional view, and 16(c) is an equivalent circuit diagram.
Figure 16B:
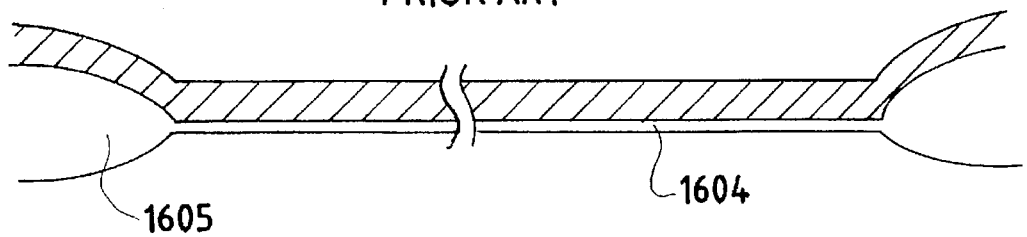
Figure 16C:
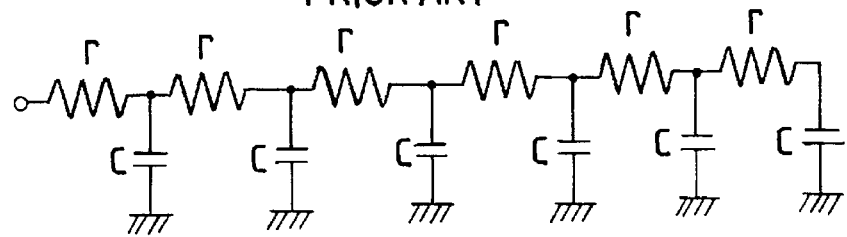
Figure 18:
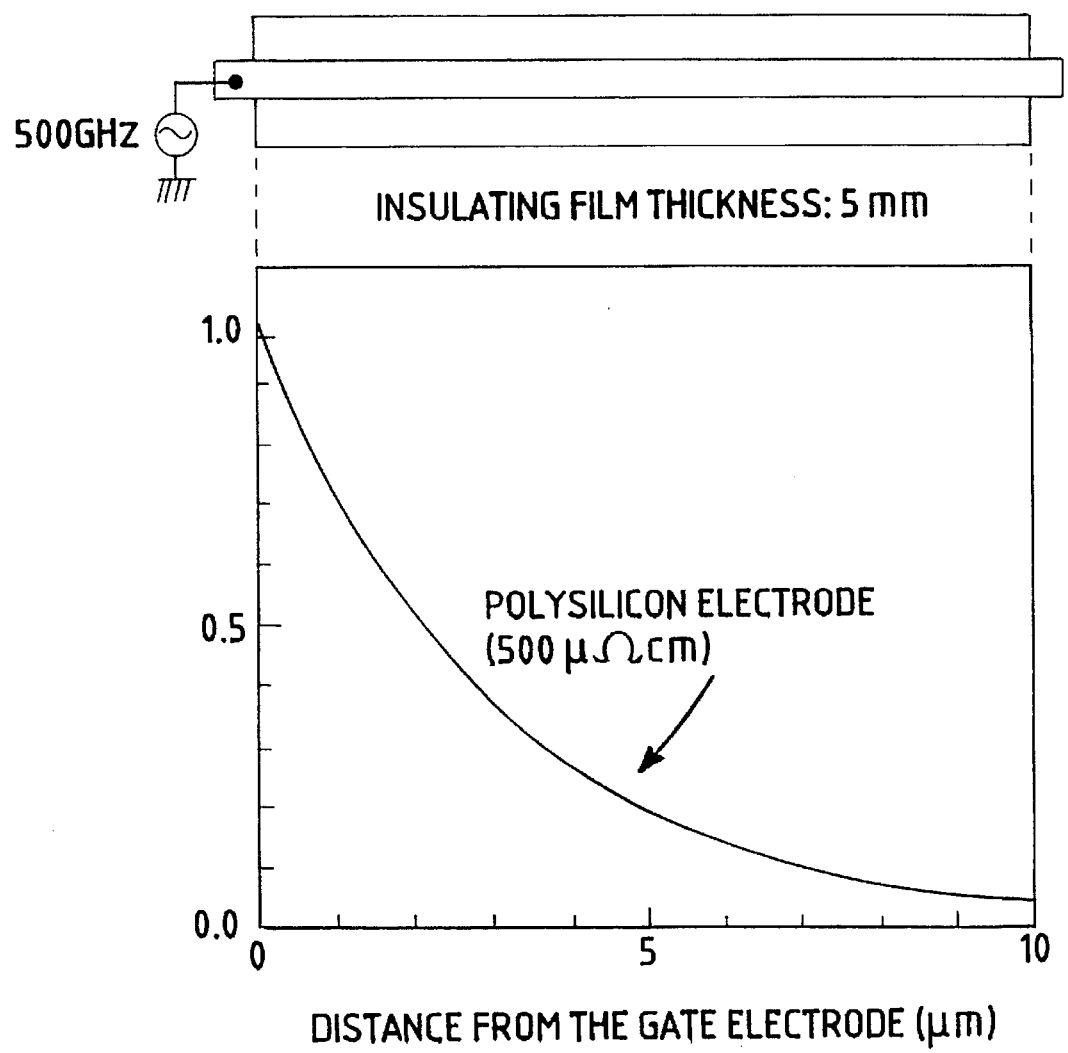
FIG. 18 is a graph showing the state of the attenuation of the signal amplitude in the case in which a high frequency signal is inputted from one end of the gate in the device shown in FIG. 16.
Figure 19:
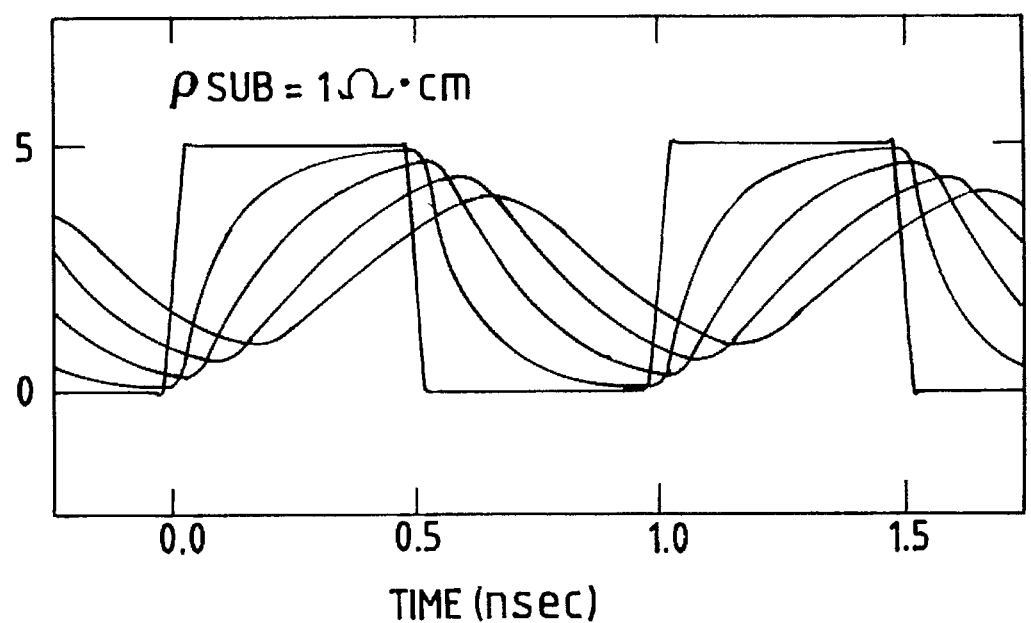
FIG. 19 is a graph showing the deterioration of the pulse waveform when propagated at normal temperatures through wiring provided on a conventional silicon substrate via an insulating film.
Figure 20:
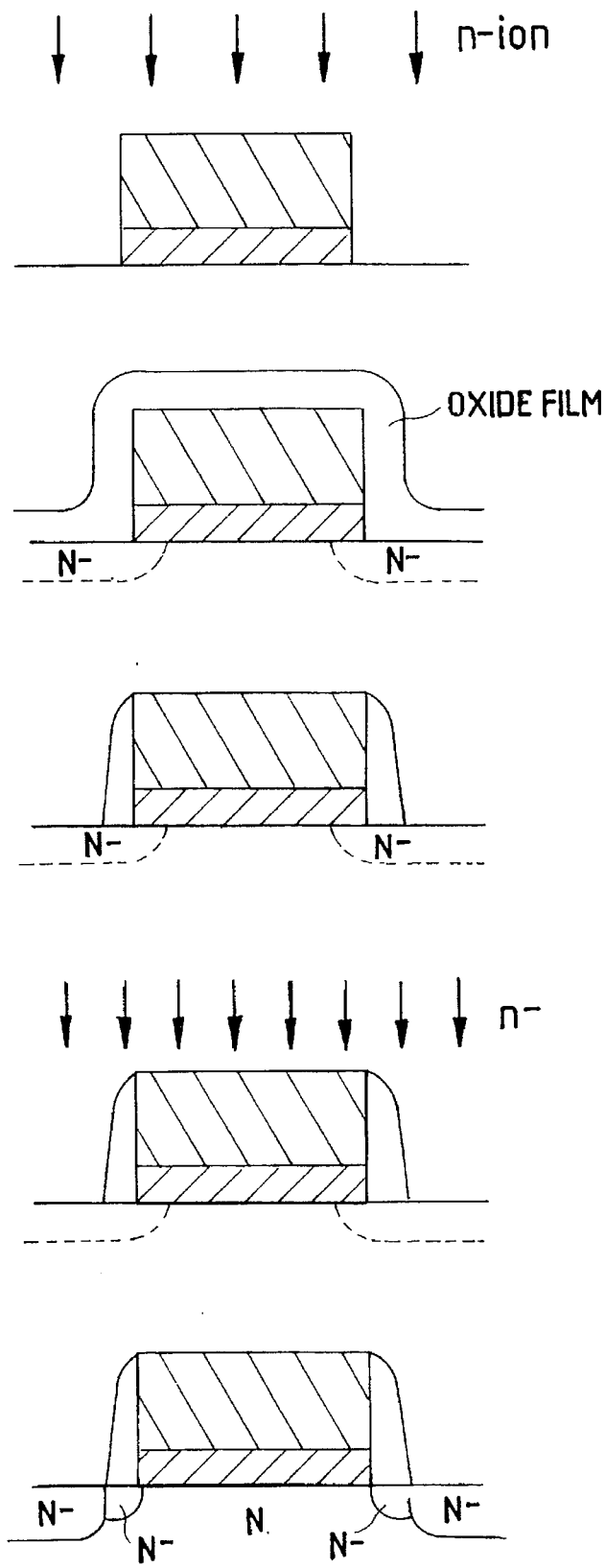
FIG. 20 shows an example of a formation method for a conventional LDD structure.

FIG. 15 shows the relationship between the power consumption and the temperature rise as measured in an IC chip possessing a surface area of 2×2 cm which was produced using the semiconductor device in accordance with the present Embodiment. When the power consumption was 1.0 W, the temperature rise in a conventional IC chip was 200° C., whereas in an IC chip into which the semiconductor device in accordance with the present invention was incorporated, the temperature rise was 25° C.

That is to say, by means of employing the semiconductor device in accordance with the present invention, the thermal noise level, which increases in proportion to the temperature rise, can be maintained at a low level, and during ultra-high speed operation, highly precise switching operations can be realized. Furthermore, performance deterioration accompanying temperature rise, such as fluctuations in the threshold value of the transistor or a decline in mobility, or the like, can also be minimized.

INDUSTRIAL APPLICABILITY

In accordance with the present invention, a semiconductor device is provided with a structure in which a first semiconductor region of a first conductivity type is provided on a metal substrate via a first insulating film, first source and drain regions of a second conductivity type are formed within this first semiconductor region, and a first metallic gate electrode is formed via a second insulating film on the region which isolates the first source and drain regions; thereby, it is possible to provide a semiconductor device having a large current driving capacity and which is capable of high speed operations.

Furthermore, in accordance with the invention as stated in claim 4, it is possible to reduce the interface state density of the semiconductor layer, and it is thus possible to further increase the current driving capacity.

Furthermore, in accordance with the invention as stated in claims 5 and 6, it is possible to further increase the dielectric strength of the gate insulating film, and it is thus possible to further increase current driving.

Furthermore, in accordance with the invention as stated in claim 11, the parasitic resistance in the source region is reduced, and there is a sufficient electric field reduction effect in the vicinity of the drain, and thereby, it is possible to realize high reliability and a high current driving capacity.

Furthermore, in accordance with the invention as stated in claims 12 and 13, a high current driving capacity is attained, and the delay period of the switching operation can be made as small as possible.

Furthermore, in accordance with the invention as stated in claim 14, the thermal noise level, which increases in proportion to the temperature rise, can be maintained at a low level, and during ultra-high speed operations, highly precise switching operations can be realized. Furthermore, performance deterioration accompanying temperature rise, such as fluctuations in the threshold value of the transistor, a decrease in mobility, and the like, can also be minimized.

We claim:

1. A semiconductor device, comprising:
   a metal substrate;
   a semiconductor region of a first conductivity type provided on said metal substrate via a first insulating film;
   a source region of a second conductivity type formed within said semiconductor region and connected to said metal substrate via metallic wiring;
   a drain region of said second conductivity type formed within said semiconductor region; and,
   a metallic gate electrode formed via a second insulating film on a region which isolates said source and drain regions.

2. The semiconductor device of claim 1, wherein at least one of said first insulating film, said semiconductor region, and said second insulating film is formed by means of a two-frequency excitation sputtering method.

3. The semiconductor device with of claim 1, wherein a relative dielectric constant of said second insulating film is at least and a thickness $t_I$ of said second insulating film satisfies Formula (1) below:

$$t_I(nm) < 3 \times (\epsilon_r/\epsilon_{SiO2}) \quad (1)$$

wherein $\epsilon_r$ is a relative dielectric constant of said second insulating film and $\epsilon_{SiO2}$ is a relative dielectric constant of silicon dioxide.

4. The semiconductor device of claim 1, wherein said second insulating film has a layered structure comprising:
   an insulating film having a relative dielectric constant of at least 8; and.
   an oxide film which is formed by the oxidation of said semiconductor region wherein said oxide film is thinner than said insulating film having a relative dielectric constant of at least 8.

5. The semiconductor device of claim 1, wherein said second insulating film is thicker at an end portion of said metallic gate electrode.

6. The semiconductor device of claim 1, wherein said metallic gate electrode is oxidized, and an oxide of the metal forming said metallic gate electrode is formed between an end portion of said metallic gate electrode and said second insulating film.

7. The semiconductor device of claim 1, wherein a thickness of said semiconductor region is within a range of 0.01–0.1 μm, and a gap between said source and drain regions is no more than 0.25 μm.

8. The semiconductor device of claim 1, wherein said source and drain regions are formed in a self-matching manner with respect to said metallic gate electrode.

9. The semiconductor device of claim 1, wherein said first insulating film possesses periodic steps.

10. The semiconductor device of claim 1, further comprising:
    a further semiconductor region of said second conductivity type formed on said metal substrate via said first insulating film;
    a further source region of the first conductivity type and provided within said further semiconductor region;
    a further drain region of the first conductivity type provided within said further semiconductor region; and,
    a further metallic gate electrode formed via said second insulating film on a region isolating said further source and drain regions.

11. The semiconductor device of claim 10, wherein said further source region is connected via metallic wiring to a metallic plate larger than the width of said metallic wiring, which is located above said further source region.

12. The semiconductor device of claim 11, wherein a mechanism in which a fluid flows is provided in said metal substrate.

13. The semiconductor device of claim 1, wherein an impurity concentration in a portion of said drain region which is adjacent to said semiconductor region of the first conductivity type is lower than an impurity concentration in said source region.

* * * * *